United States Patent
Fukunaga

(10) Patent No.: US 9,147,817 B2
(45) Date of Patent: Sep. 29, 2015

(54) SEMICONDUCTOR LIGHT-EMITTING ELEMENT, LIGHT SOURCE HEAD, AND IMAGE FORMING APPARATUS

(71) Applicant: FUJI XEROX CO., LTD., Minato-ku, Tokyo (JP)

(72) Inventor: Hideki Fukunaga, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/028,674

(22) Filed: Sep. 17, 2013

(65) Prior Publication Data
US 2015/0077497 A1 Mar. 19, 2015

(51) Int. Cl.
B41J 2/385 (2006.01)
H01L 33/50 (2010.01)
G03G 15/04 (2006.01)

(52) U.S. Cl.
CPC ........ H01L 33/507 (2013.01); G03G 15/04054 (2013.01)

(58) Field of Classification Search
CPC ............. H01L 33/507; H01L 51/5012; H01L 51/5024; H01L 51/504; H01L 27/153; G03G 15/04054; B41J 2/451; B41J 2/385
USPC ......... 347/120, 111, 118, 127, 224, 238, 243, 347/130; 257/107, 84, 85, 79, 437, 98, 112, 257/102; 438/22; 313/503, 504, 506
See application file for complete search history.

(56) References Cited

U.S. PATENT DOCUMENTS

| | | | | |
|---|---|---|---|---|
| 5,226,053 A * | 7/1993 | Cho et al. | | 372/45.01 |
| 5,361,273 A * | 11/1994 | Kosaka | | 372/50.23 |
| 8,564,013 B2 * | 10/2013 | Fukunaga | | 257/102 |
| 2006/0082285 A1 * | 4/2006 | Wu et al. | | 313/503 |
| 2009/0297223 A1 * | 12/2009 | Suzuki | | 399/221 |

FOREIGN PATENT DOCUMENTS

| | | | |
|---|---|---|---|
| JP | 1-200678 A | | 8/1989 |
| JP | 5-275739 A | | 10/1993 |
| JP | 6-196681 A | | 7/1994 |
| JP | 2003-332615 A | | 11/2003 |
| JP | 2009-70929 A | | 4/2009 |
| JP | 2009070929 A | * | 4/2009 |

* cited by examiner

*Primary Examiner* — Alessandro Amari
*Assistant Examiner* — Michael Konczal
(74) *Attorney, Agent, or Firm* — Sughrue Mion, PLLC

(57) ABSTRACT

A semiconductor light-emitting element formed of a semiconductor layer includes a multilayer reflecting mirror, a light-emitting layer, a resonator, and a phase shift layer. The multilayer reflecting mirror is formed on a substrate. The light-emitting layer is formed on the multilayer reflecting mirror. The resonator uses the multilayer reflecting mirror as a lower reflecting mirror and resonates light emitted from the light-emitting layer. The phase shift layer shifts a phase of a resonance spectrum of the resonator to generate a standing wave having plural principal modes.

20 Claims, 28 Drawing Sheets

FIG. 9

| LAYER | | Al COMPOSITION | FILM THICKNESS (λ) | DOPANT |
|---|---|---|---|---|
| p-GaAs CONTACT LAYER | | 0 | 0.142 | Zn |
| p-AlGaAs PHASE ADJUSTMENT LAYER | | 0.30 | 2.138 | Zn |
| p-PHASE SHIFT LAYER | | 0.90 | 0.25 | Zn |
| | | 0.30 | 0.5 | Zn |
| | | 0.90 | 0.25 | Zn |
| p-AlGaAs BARRIER LAYER | | 0.30 | 1.25 | Zn |
| i-AlGaAs ACTIVE LAYER | | 0.14 | 0.5 | — |
| n-AlGaAs BARRIER LAYER | | 0.30 | 1.75 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 12

| LAYER | | Al COMPOSITION | FILM THICKNESS ($\lambda$) | DOPANT |
|---|---|---|---|---|
| p-GaAs CONTACT LAYER | | 0 | 0.142 | Zn |
| p-AlGaAs PHASE ADJUSTMENT LAYER | | 0.30 | 0.138 | Zn |
| p-PHASE SHIFT LAYER | | 0.90 | 0.25 | Zn |
| | | 0.30 | 0.5 | Zn |
| | | 0.90 | 0.25 | Zn |
| p-AlGaAs RESONATOR ADJUSTMENT LAYER | | 0.30 | 2.0 | Zn |
| p-AlGaAs BARRIER LAYER | | 0.30 | 1.5 | Zn |
| i-AlGaAs ACTIVE LAYER | | 0.14 | 0.5 | — |
| n-AlGaAs BARRIER LAYER | | 0.30 | 1.5 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 13

| LAYER | | Al COMPOSITION | FILM THICKNESS (λ) | DOPANT |
|---|---|---|---|---|
| p-GaAs CONTACT LAYER | | 0 | 0.142 | Zn |
| p-AlGaAs PHASE ADJUSTMENT LAYER | | 0.30 | 0.138 | Zn |
| p-DBR LAYER | 4-LAYER REPETITION | 0.90 | 0.25 | Zn |
| | | 0.30 | 0.25 | Zn |
| p-PHASE SHIFT LAYER | | 0.90 | 0.25 | Zn |
| | | 0.30 | 0.5 | Zn |
| | | 0.90 | 0.25 | Zn |
| p-AlGaAs BARRIER LAYER | | 0.30 | 1.25 | Zn |
| i-AlGaAs ACTIVE LAYER | | 0.14 | 0.5 | — |
| n-AlGaAs BARRIER LAYER | | 0.30 | 1.75 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 14

| LAYER | | Al COMPOSITION | FILM THICKNESS (λ) | DOPANT |
|---|---|---|---|---|
| p-GaAs CONTACT LAYER | | 0 | 0.142 | Zn |
| p-AlGaAs PHASE ADJUSTMENT LAYER | | 0.30 | 0.138 | Zn |
| p-PHASE SHIFT DBR LAYER | 4-LAYER REPETITION | 0.90 | 0.25 | Zn |
| | | 0.30 | 0.25 | Zn |
| p-AlGaAs BARRIER LAYER | | 0.30 | 1.25 | Zn |
| i-AlGaAs ACTIVE LAYER | | 0.14 | 0.5 | — |
| n-AlGaAs BARRIER LAYER | | 0.30 | 1.75 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 15

| LAYER | | Al COMPOSITION | FILM THICKNESS (λ) | DOPANT |
|---|---|---|---|---|
| n-GaAs CONTACT LAYER | | 0 | 0.142 | Si |
| p-AlGaAs PHASE ADJUSTMENT LAYER | | 0.30 | 2.138 | Si |
| n-PHASE SHIFT LAYER | | 0.90 | 0.25 | Si |
| | | 0.30 | 0.5 | Si |
| | | 0.90 | 0.25 | Si |
| p-AlGaAs GATE LAYER | | 0.30 | 1.5 | Zn |
| i-AlGaAs ACTIVE LAYER | | 0.14 | 0.5 | — |
| n-AlGaAs GATE LAYER | | 0.30 | 1.55 | Si |
| p-DBR LAYER | 10-LAYER REPETITION | 0.90 | 0.25 | Zn |
| | | 0.30 | 0.25 | Zn |
| p-GaAs BUFFER LAYER | | 0 | 0.24 | Zn |
| p-GaAs SUBSTRATE | | 0 | — | — |

FIG. 21

| LAYER | | Al COMPOSITION | FILM THICKNESS (λ) | DOPANT |
|---|---|---|---|---|
| SiNx | | — | 1.25 | |
| p-GaAs CONTACT LAYER | | 0 | 0.116 | Zn |
| p-AlGaAs PHASE ADJUSTMENT LAYER | | 0.30 | 0.38 | Zn |
| p-PHASE SHIFT LAYER | | 0.90 | 0.25 | Zn |
| | | 0.30 | 0.5 | Zn |
| | | 0.90 | 0.25 | Zn |
| p-AlGaAs BARRIER LAYER | | 0.30 | 1.75 | Zn |
| i-AlGaAs ACTIVE LAYER | | 0.14 | 0.5 | — |
| n-AlGaAs BARRIER LAYER | | 0.30 | 1.25 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 22

| LAYER | | Al COMPOSITION | FILM THICKNESS (λ) | DOPANT |
|---|---|---|---|---|
| SiNx | | — | 1.25 | |
| p-GaAs CONTACT LAYER | | 0 | 0.116 | Zn |
| p-AlGaAs PHASE ADJUSTMENT LAYER | | 0.30 | 0.38 | Zn |
| p-PHASE SHIFT LAYER | | 0.90 | 0.25 | Zn |
| | | 0.30 | 0.5 | Zn |
| | | 0.90 | 0.25 | Zn |
| | | 0.30 | 0.5 | Zn |
| | | 0.90 | 0.25 | Zn |
| p-AlGaAs BARRIER LAYER | | 0.30 | 1.75 | Zn |
| i-AlGaAs ACTIVE LAYER | | 0.14 | 0.5 | — |
| n-AlGaAs BARRIER LAYER | | 0.30 | 1.25 | Si |
| n-DBR LAYER | 10-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

FIG. 23

| LAYER | | Al COMPOSITION | FILM THICKNESS ($\lambda$) | DOPANT |
|---|---|---|---|---|
| SiNx | | — | 1.25 | |
| p-GaAs CONTACT LAYER | | 0 | 0.116 | Zn |
| p-AlGaAs PHASE ADJUSTMENT LAYER | | 0.35 | 2.13 | Zn |
| p-AlGaAs BARRIER LAYER | | 0.30 | 1.75 | Zn |
| i-AlGaAs ACTIVE LAYER | | 0.14 | 0.5 | — |
| n-AlGaAs BARRIER LAYER | | 0.30 | 1.25 | Si |
| n-PHASE SHIFT LAYER | | 0.90 | 0.25 | Si |
| | | 0.30 | 0.5 | Si |
| | | 0.90 | 0.25 | Si |
| n-DBR LAYER | 8-LAYER REPETITION | 0.90 | 0.25 | Si |
| | | 0.30 | 0.25 | Si |
| n-GaAs BUFFER LAYER | | 0 | 0.24 | Si |
| n-GaAs SUBSTRATE | | 0 | — | — |

SEMICONDUCTOR LIGHT-EMITTING ELEMENT, LIGHT SOURCE HEAD, AND IMAGE FORMING APPARATUS

CROSS REFERENCES TO RELATED APPLICATIONS

The present invention contains subject matter related to Japanese Patent Application No. 2012-023371 filed in the Japan Patent Office on Feb. 6, 2012, the entire contents of which are incorporated herein by reference.

BACKGROUND

Technical Field

The present invention relates to a semiconductor light-emitting element, a light source head, and an image forming apparatus.

SUMMARY

According to an aspect of the invention, there is provided a semiconductor light-emitting element formed of a semiconductor layer and including a multilayer reflecting mirror, a light-emitting layer, a resonator, and a phase shift layer. The multilayer reflecting mirror is formed on a substrate. The light-emitting layer is formed on the multilayer reflecting mirror. The resonator uses the multilayer reflecting mirror as a lower reflecting mirror and resonates light emitted from the light-emitting layer. The phase shift layer shifts a phase of a resonance spectrum of the resonator to generate a standing wave having plural principal modes.

BRIEF DESCRIPTION OF THE DRAWINGS

Exemplary embodiments of the present invention will be described in detail based on the following figures, wherein:

FIG. 9 is an explanatory diagram illustrating a specific example of the Al composition and film thickness of each layer of a semiconductor light-emitting element according to Example 1;

FIG. 12 is an explanatory diagram illustrating a specific example of the Al composition and film thickness of each layer of a semiconductor light-emitting element according to Example 2;

FIG. 13 is an explanatory diagram illustrating a specific example of the Al composition and film thickness of each layer of a semiconductor light-emitting element according to Example 3;

FIG. 14 is an explanatory diagram illustrating a specific example of the Al composition and film thickness of each layer of a semiconductor light-emitting element according to Example 4;

FIG. 15 is an explanatory diagram illustrating a specific example of the Al composition and film thickness of a semiconductor light-emitting element according to Example 5;

FIG. 21 is an explanatory diagram illustrating a specific example of the Al composition and film thickness of each layer of the semiconductor light-emitting element according to Example 1;

FIG. 22 is an explanatory diagram illustrating a specific example of the Al composition and film thickness of each layer of the semiconductor light-emitting element according to Example 2;

FIG. 23 is an explanatory diagram illustrating a specific example of the Al composition and film thickness of each layer of the semiconductor light-emitting element according to Example 3;

DETAILED DESCRIPTION

Exemplary embodiments of the present invention will be explained in detail with reference to the drawings.

Figure 1:
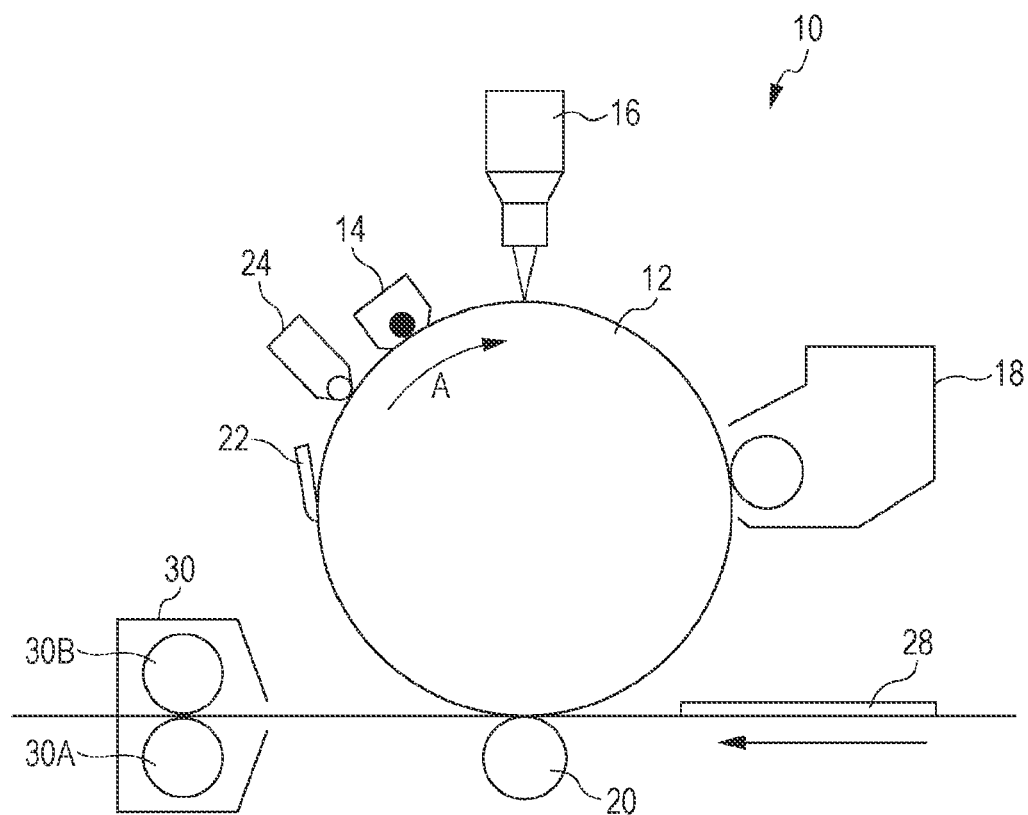
FIG. 1 is a schematic configuration diagram illustrating the outline of an example of an image forming apparatus according to an exemplary embodiment.
Figure 2:
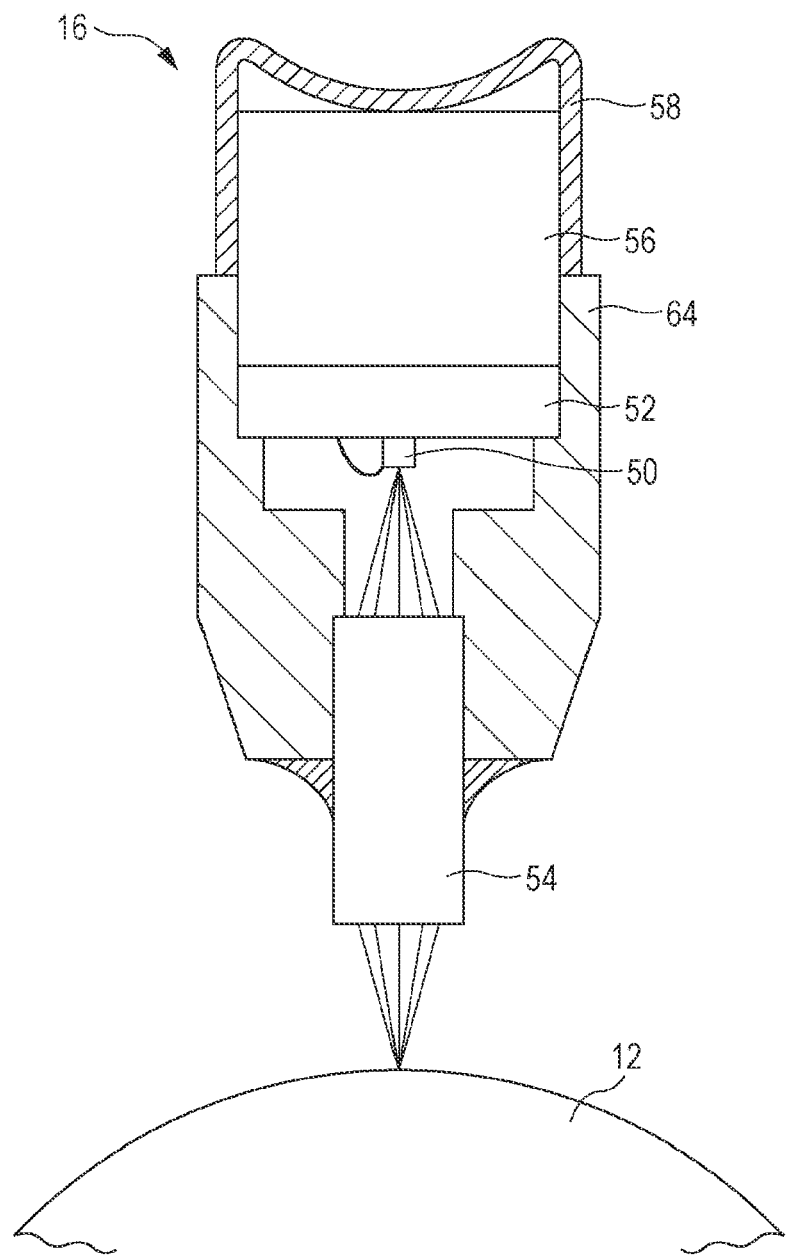
FIG. 2 is a schematic cross-sectional view illustrating the internal configuration of an example of a light source head according to an exemplary embodiment.
Figure 3:
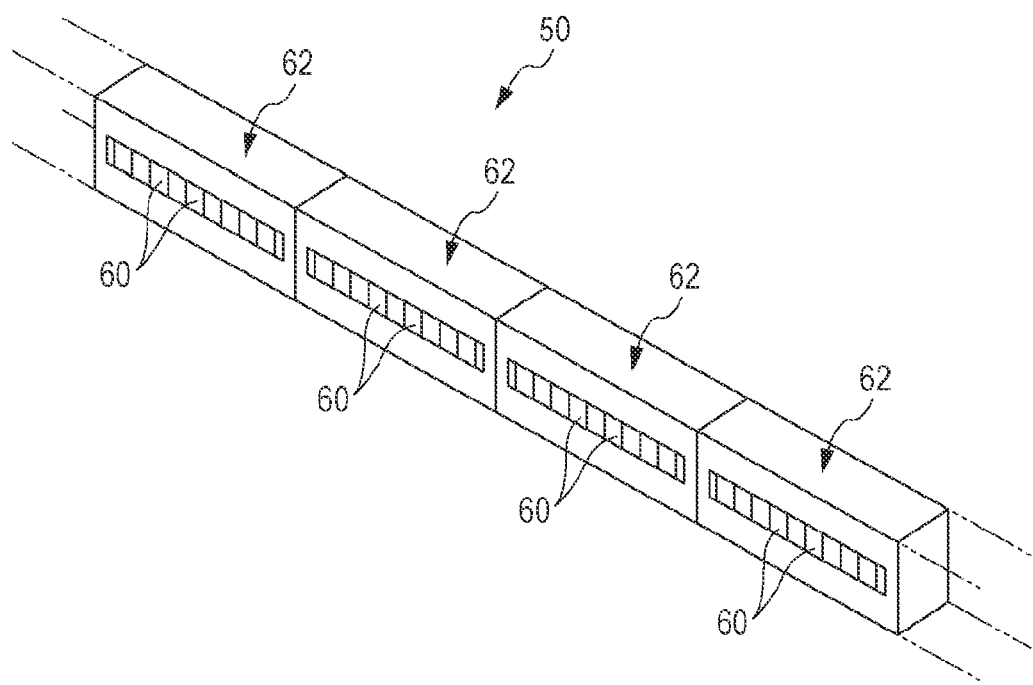
FIG. 3 is an external perspective view of an example of a semiconductor light-emitting element array according to an exemplary embodiment.

FIG. 1 is a schematic configuration diagram illustrating the outline of an example of an image forming apparatus according to an exemplary embodiment. FIG. 2 is a schematic cross-sectional view illustrating the internal configuration of an example of a light source head according to an exemplary embodiment. FIG. 3 is an external perspective view illustrating an example of a semiconductor light-emitting element array according to an exemplary embodiment.

An image forming apparatus 10 according to an exemplary embodiment includes a photoreceptor 12 that rotates at a constant speed in a direction of an arrow A, as illustrated in FIG. 1.

Along the rotation direction of the photoreceptor 12, a charging unit 14 that charges the surface of the photoreceptor 12, a light source head 16 (exposure unit) for performing exposure in order to form an electrostatic latent image on the surface of the photoreceptor 12 charged by the charging unit 14, a developing unit 18 (developing unit) that develops, using a developer, the electrostatic latent image in order to form a toner image, a transfer body 20 (transfer unit) that transfers the toner image onto paper 28 (recording medium), a cleaner 22 for removing residual toner remaining on the photoreceptor 12 after transfer is performed, and an erase lamp 24 that discharges the photoreceptor 12 to achieve a uniform potential are arranged in order around the photoreceptor 12.

That is, after the surface of the photoreceptor 12 is charged by the charging unit 14, the photoreceptor 12 is irradiated with optical beam by the light source head 16. Thus, a latent image is formed on the photoreceptor 12. The light source head 16 is connected to a driving unit (not illustrated). Under the control of a driving unit for lighting of a semiconductor light-emitting element 100, the light source head 16 emits optical beam on the basis of image data.

The formed latent image is supplied with toner by the developing unit 18, and a toner image is formed on the photoreceptor 12. The toner image formed on the photoreceptor 12 is transferred by the transfer body 20 onto the paper 28 that has been conveyed. Toner remaining on the photoreceptor 12 after the transfer is performed is removed by the cleaner 22. After the photoreceptor 12 is discharged by the erase lamp 24, the photoreceptor 12 is charged again by the charging unit 14. Accordingly, similar processing is performed repeatedly.

Meanwhile, the paper 28 onto which the toner image has been transferred is conveyed to a fixing unit 30 (fixing unit) including a pressure roller 30A and a heating roller 30B, and fixing processing is performed on the paper 28. Accordingly, the toner image is fixed to the paper 28, and a desired image is formed on the paper 28. The paper 28 on which the image has been formed is ejected outside the apparatus.

The configuration of the light source head 16 according to this exemplary embodiment will now be explained in detail. The light source head 16 according to this exemplary embodiment includes a self-scanning light-emitting diode (SLED). The SLED is an integration of an LED array and a driving portion for the LED array and includes plural light-emitting units (semiconductor light-emitting elements 100, explained in detail below) having a thyristor configuration. As illustrated in FIG. 2, the light source head 16 includes a semiconductor light-emitting element array 50, a mount board 52 which supports the semiconductor light-emitting element array 50 and on which a circuit (not illustrated) for supplying various signals for controlling the driving of the semiconductor light-emitting element array 50 is mounted, and a rod lens array 54, such as a SELFOC® lens array (SELFOC is a registered trademark of Nippon Sheet Glass Co., Ltd.).

The mount board 52 is arranged inside a housing 56 in such a manner that the surface on which the semiconductor light-emitting element array 50 is mounted faces the photoreceptor 12, and is supported by a plate spring 58.

As illustrated in FIG. 3, the semiconductor light-emitting element array 50 is configured such that, for example, chips 62 each including plural semiconductor light-emitting elements 100 that are arranged along the axial direction of the photoreceptor 12 in accordance with resolutions in the axial direction are arranged in series with one another. The semiconductor light-emitting element array 50 is configured to emit optical beam at a predetermined resolution in the axial direction of the photoreceptor 12.

Although the example in which the plural chips 62 are arranged in series with one another in a one-dimensional manner is explained in this exemplary embodiment, the chips 62 may be arranged in a two-dimensional manner by arranging the chips 62 so as to form plural lines. For example, in the case where the chips 62 are arranged in a houndstooth check pattern, the chips 62 are arranged in a line along the axial direction of the photoreceptor 12 and are arranged in two lines in the direction orthogonal to the axial direction with a specific space therebetween. Although the semiconductor light-emitting elements 100 are divided in units each including plural chips 62, the plural semiconductor light-emitting elements 100 are arranged in such a manner that a space in the axial direction of the photoreceptor 12 between adjacent two semiconductor light-emitting elements 100 is substantially the same among all the plural semiconductor light-emitting elements 100.

As illustrated in FIG. 2, the rod lens array 54 is supported by a holder 64, and forms an image on the photoreceptor 12 on the basis of optical beam emitted from each of the semiconductor light-emitting elements 100.

Before explaining in detail the semiconductor light-emitting elements 100 according to this exemplary embodiment, semiconductor light-emitting elements according to a related art will first be explained, for the sake of comparison.

Figure 24:
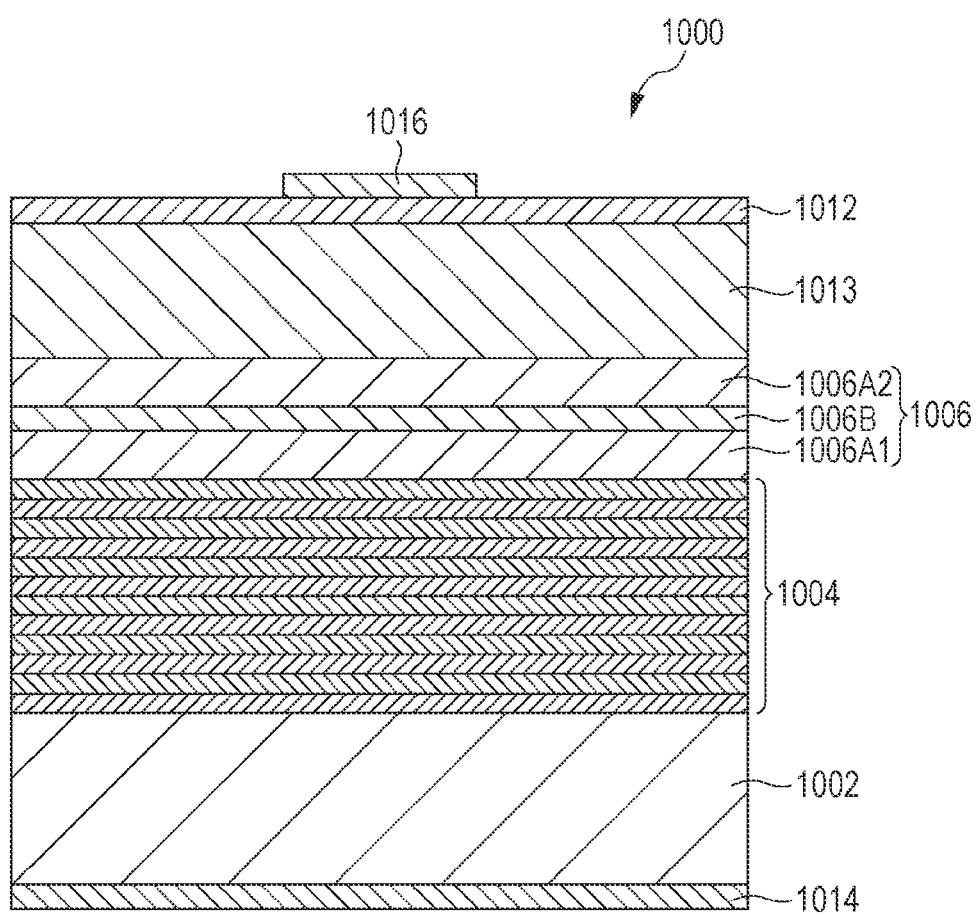
FIG. 24 is a cross-sectional view of the basic schematic configuration of an example of a semiconductor light-emitting element according to a related art.

FIG. 24 is a cross-sectional view of the schematic configuration of an example of a semiconductor element (light-emitting diode) according to a related art. A light-emitting diode 1000 according to a related art includes a substrate 1002, a distributed Bragg reflector (DBR) layer 1004, a light-emitting layer 1006, a clad layer 1013, a contact layer 1012, a lower electrode 1014, and an upper electrode 1016. The light-emitting layer 1006 includes a barrier layer 1006A1, an active layer 1006B, and a light-emitting layer 1006A2.

Figure 25:
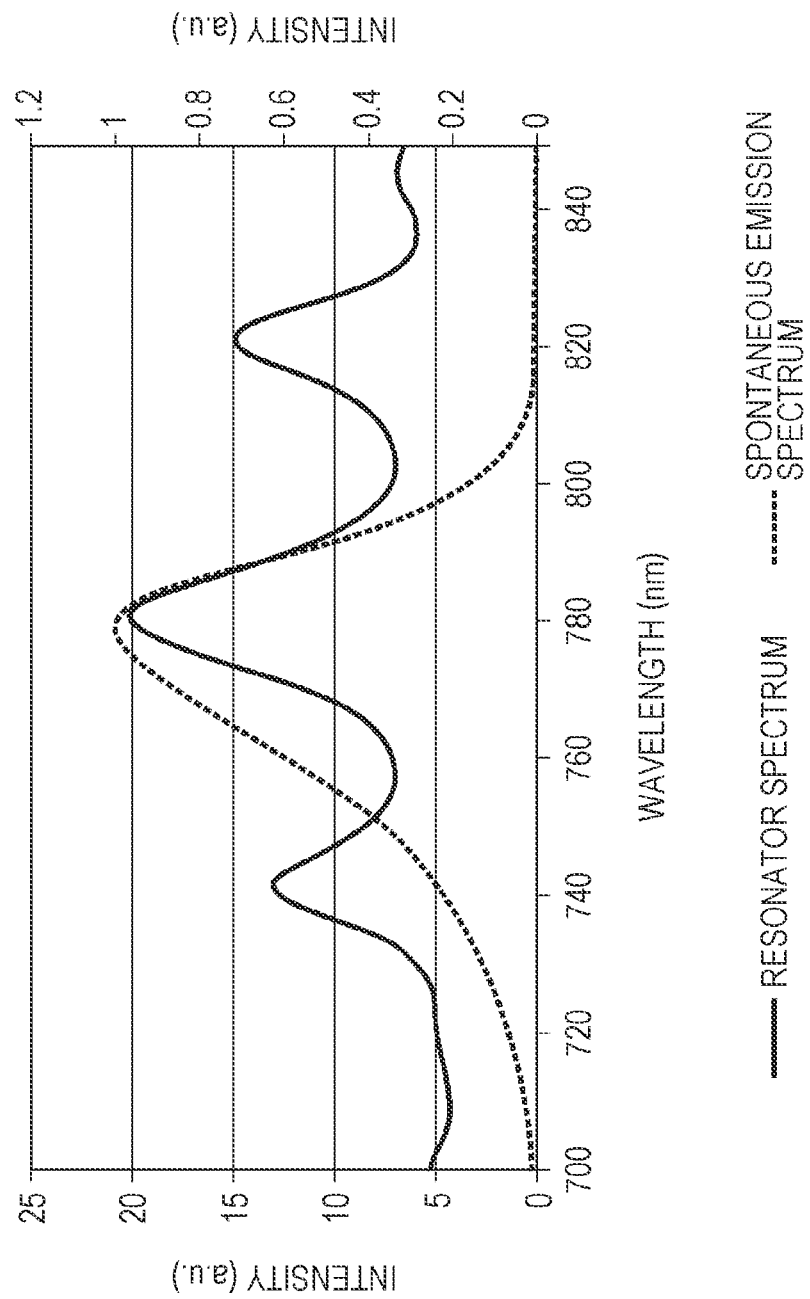
FIG. 25 is an explanatory diagram for explaining a specific example of the wavelength and intensity of the spontaneous emission spectrum and resonator spectrum of the semiconductor light-emitting element according to the related art.
Figure 26:
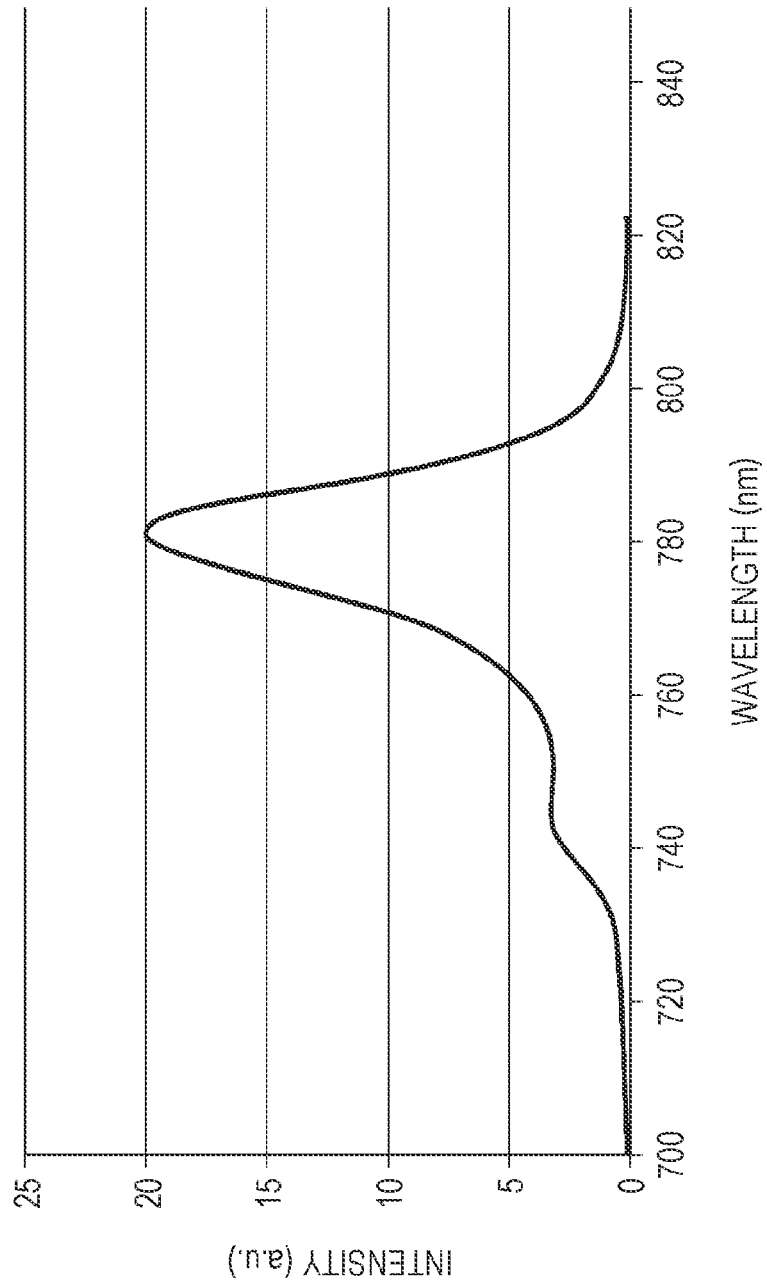
FIG. 26 is an explanatory diagram for explaining a specific example of the wavelength and intensity of the emission spectrum in the case illustrated in FIG. 25.

In the light-emitting diode 1000 according to the related art, the interface between the contact layer 1012 and the upper electrode 1016 functions as an upper mirror. The upper mirror, the light-emitting layer 1006, and the DBR layer 1004 form a resonator. The emission spectrum of light emitted from the light-emitting diode 1000 is obtained by multiplying the resonator spectrum of the resonator with the spontaneous emission spectrum by the light-emitting layer 1006. Here, the spectrum of light emitted outside the light-emitting layer when wavelength-independent white light is emitted from the light-emitting layer, the spectrum being determined on the basis of the layer structure of the light-emitting diode, is defined as a resonator spectrum. FIG. 25 illustrates a specific example of the wavelength and intensity of the spontaneous emission spectrum and resonator spectrum of the light-emitting diode 1000. FIG. 26 illustrates a specific example of the wavelength and intensity of the emission spectrum in this case. The resonator spectrum is determined on the basis of the structure of the resonator, and the spontaneous emission spectrum is determined on the basis of the materials of the light-emitting layer 1006. As illustrated in FIGS. 25 and 26, the wavelength selectivity of the emission spectrum of emission light is generated by the resonator spectrum, and the emission spectrum is sharper than the spontaneous emission spectrum.

Figure 27:
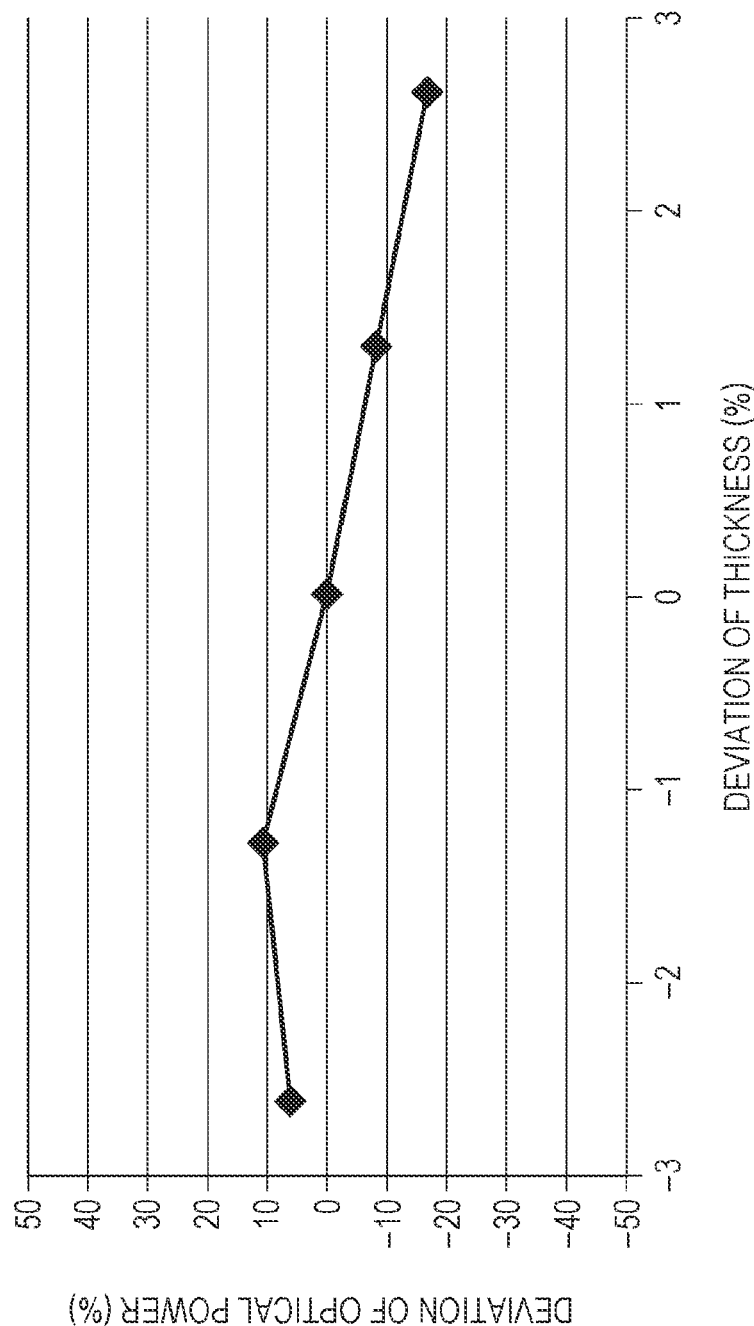
FIG. 27 is an explanatory diagram illustrating the relationship between the thickness and the optical power of the semiconductor light-emitting element according to the related art.

In the case of the above-described semiconductor light-emitting element such as a light-emitting diode, since, in general, film thickness distribution occurs in the process of manufacturing, due to variations in the crystal growth rate inside a wafer, peaks of the resonator spectrum are distributed inside the wafer. Thus, distribution of the difference between the wavelength of the resonator and the wavelength of spontaneous emission occurs, and variations in the optical power may occur inside the wafer. As described above, occurrence of variations inside the wafer causes the optical power to vary from light-emitting diode to light-emitting diode. FIG. 27 illustrates the relationship between the thickness and the optical power of the light-emitting diode according to the related art. As illustrated in FIG. 27, the optical power (light intensity) varies according to the film thickness.

Figure 28:
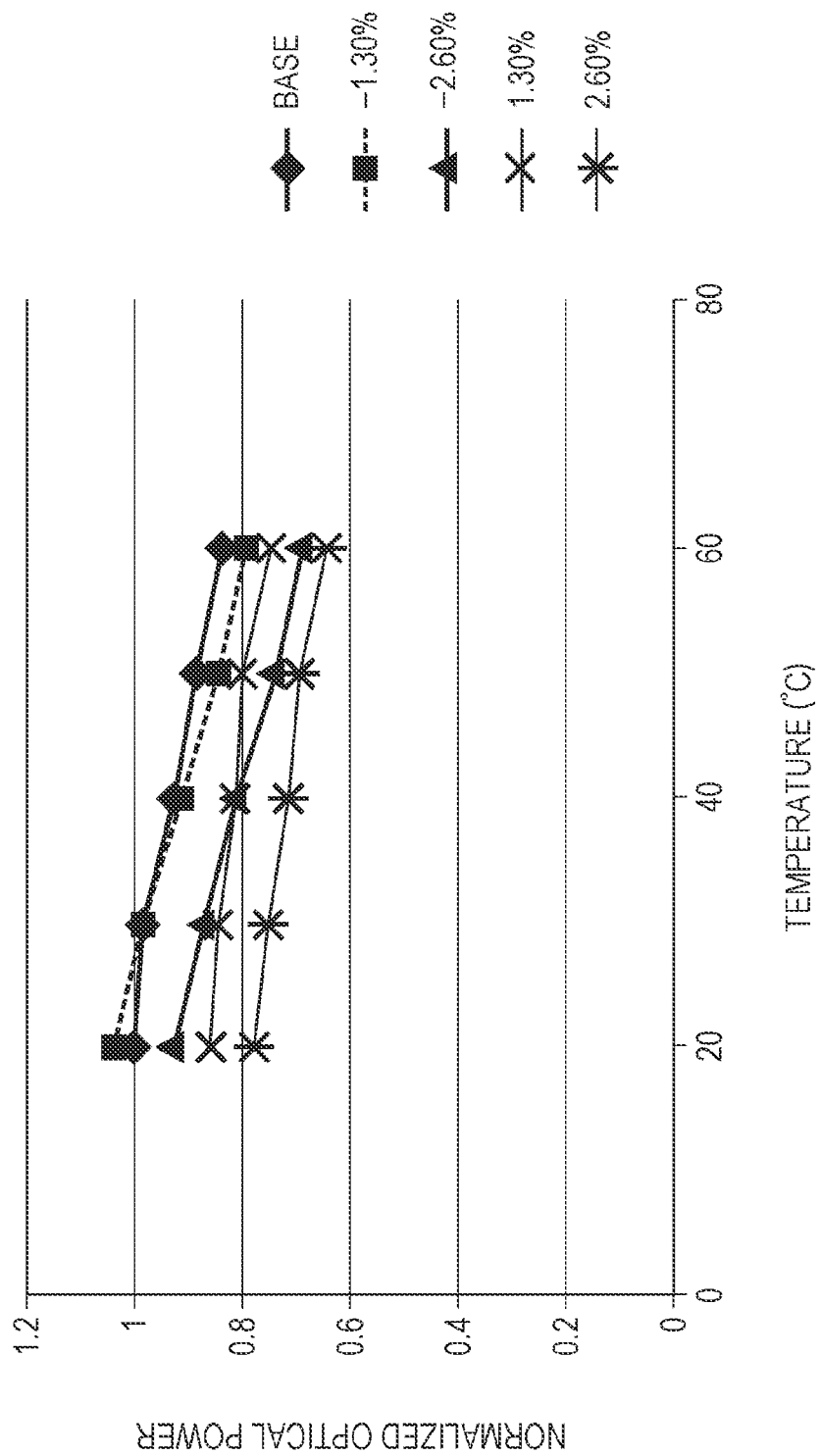
FIG. 28 is an explanatory diagram illustrating the temperature characteristics of the semiconductor light-emitting element according to the related art.

Furthermore, since the temperature dependency of the wavelength of the resonator is lower than the temperature dependency of the spontaneous emission wavelength of the light-emitting layer 1006, a temperature change brings about a situation in which a peak (principal mode) of the resonator spectrum is deviated from a peak of the spontaneous emission spectrum. As a result, temperature-dependent variations according to the film thickness are increased, as illustrated in FIG. 28.

For example, in the case where the above-mentioned light source head 16 includes a light-emitting diode array including plural light-emitting diodes, if the optical power varies for each semiconductor light-emitting element, the image quality of a formed image is degraded. In order to suppress variations in the optical power, the optical power may be adjusted separately for each semiconductor light-emitting element. In this case, however, in order to separately provide a mechanism and the like for adjusting the optical power, the cost and size of the apparatus may be increased.

The semiconductor light-emitting elements 100 according to an exemplary embodiment will now be explained in detail.

First Exemplary Embodiment

Figure 4:
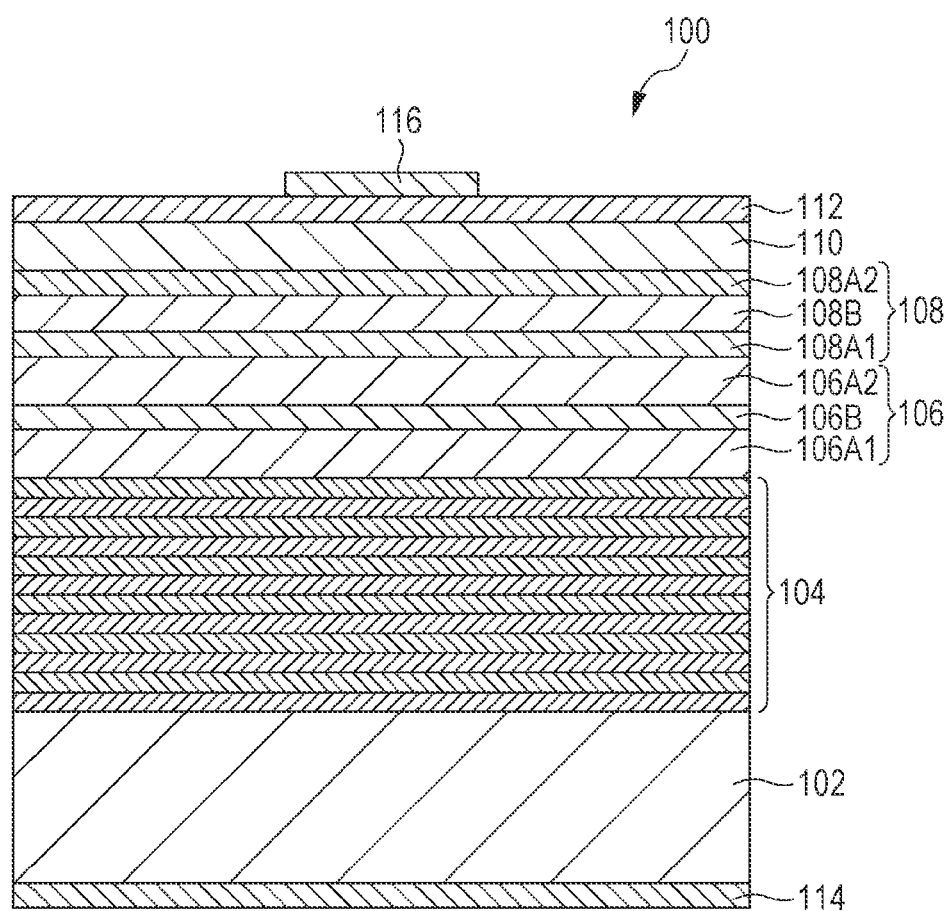
FIG. 4 is a cross-sectional view illustrating the basic schematic configuration of an example of a semiconductor light-emitting element according to a first exemplary embodiment.

The basic schematic configuration of each of the semiconductor light-emitting elements 100 according to a first exemplary embodiment will first be explained. FIG. 4 is a cross-sectional view of the basic schematic configuration of an example of each of the semiconductor light-emitting elements 100 according to the first exemplary embodiment. Here, the case where a resonant cavity light-emitting diode (RCLED) including a λ resonator of an $Al_xGa_{1-x}As$-system is used as the semiconductor light-emitting element 100, will be explained.

The semiconductor light-emitting element 100 includes a substrate 102, a DBR layer 104, a light-emitting layer 106, a phase shift layer 108, a phase adjustment layer 110, a contact layer 112, a lower electrode 114, and an upper electrode 116.

Materials suitable for excellent ohmic contact with a semiconductor layer or the p-type GaAs substrate 102 are used as the materials of the lower electrode 114 and the upper electrode 116. Specific examples of the materials include gold (Au), an alloy of gold and germanium (AuGe), an alloy of gold and zinc (AuZn), nickel (Ni), and the like.

The light-emitting layer 106 has a structure in which a non-doped active layer 106B is sandwiched between a barrier layer 106A1 and a barrier layer 106A2. In the semiconductor light-emitting element 100 according to the first exemplary embodiment, when voltage is applied between the lower electrode 114 and the upper electrode 116, the active layer 106B is excited, and carriers (electrons and positive holes) are recombined together inside the active layer 106B. By this recombination, light is generated.

In the first exemplary embodiment, the interface between the contact layer 112 and the upper electrode 116 functions as an upper mirror. The upper mirror and the DBR layer 104 form a resonator for resonating light emitted by the light-emitting layer 106. Furthermore, the phase shift layer 108 and the DBR layer 104 form a resonator.

The phase shift layer 108 has a function of shifting (modulating) a phase to generate a standing wave of a resonator spectrum having plural principal modes (details will be provided later).

Provided that the peak wavelength of light inside the semiconductor light-emitting element 100 is represented by λ, a first semiconductor layer 108A1 having a film thickness of λ/4, a second semiconductor layer 108B having a film thickness of λ/2, and a first semiconductor layer 108A2 having a film thickness of λ/4 are stacked in that order from the side of the substrate 102 in the phase shift layer 108. In the case where the reference wavelength (peak wavelength of emission light) extracted outside is represented by λ0 and the refractive index when light having the reference wavelength λ0 is propagated in a resonator or a semiconductor layer (here, AlGaAs) forming the light-emitting layer 106 is represented by n, the peak wavelength λ is represented by λ0/n. In the first exemplary embodiment, for example, the reference wavelength λ0 is 780 nm.

Figure 5:
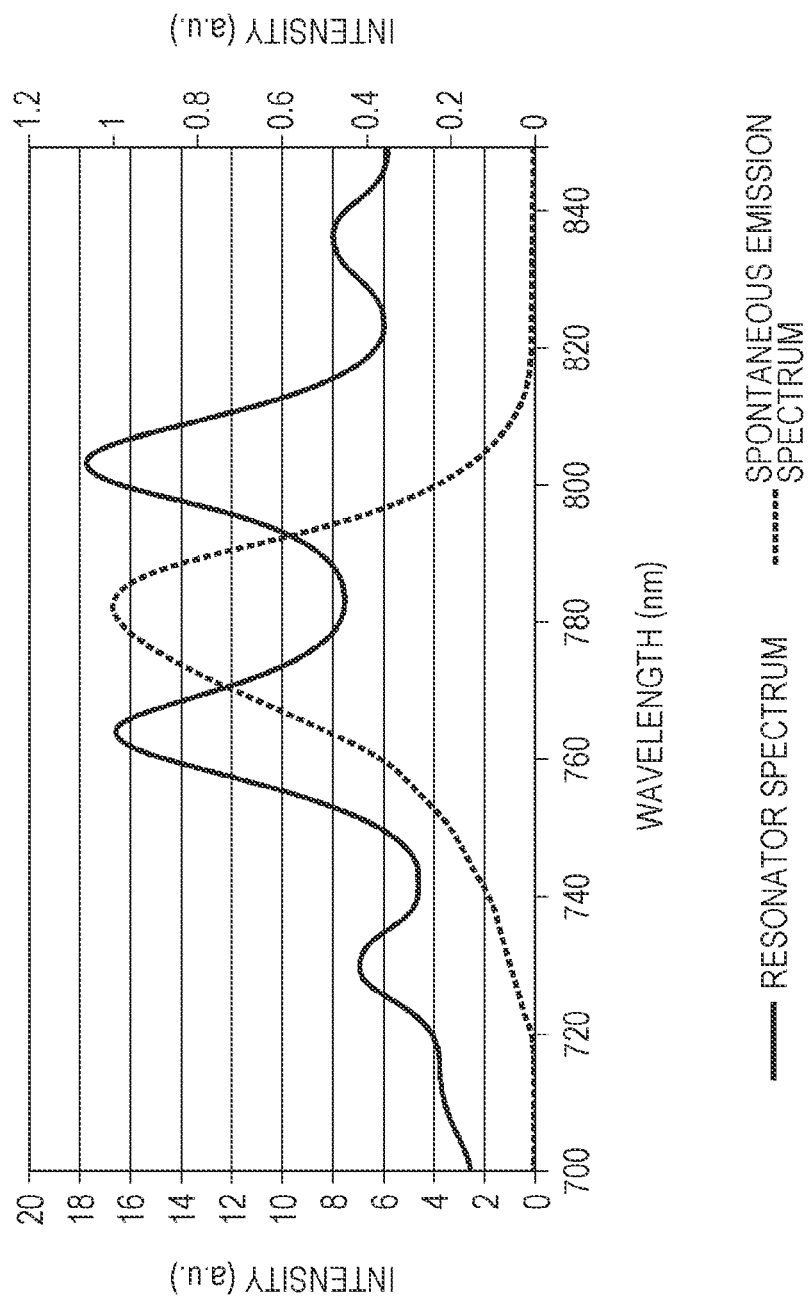
FIG. 5 is an explanatory diagram for explaining a specific example of the wavelength and intensity of the spontaneous emission spectrum and resonator spectrum of a semiconductor light-emitting element, which is an RCLED, according to the first exemplary embodiment.

The emission spectrum of light emitted from the light-emitting surface of the semiconductor light-emitting element 100 (surface on which the upper electrode 116 is formed) is obtained by multiplying the spontaneous emission spectrum in the light-emitting layer 106 with the resonator spectrum of the above-described resonator. FIG. 5 illustrates a specific example of the wavelength and intensity of the spontaneous emission spectrum and resonator spectrum of the semiconductor light-emitting element 100, which is as an RCLED, according to the first exemplary embodiment. Furthermore, FIG. 6 illustrates a specific example of the wavelength and intensity of the emission spectrum in this case.

As illustrated in FIG. 5, the resonator spectrum of the semiconductor light-emitting element 100 according to the first exemplary embodiment has two principal modes. In the first exemplary embodiment, a principal mode represents a peak wavelength that is equal to or greater than a specific wavelength. Since a semiconductor layer includes plural layers having different refractive indices, reflection occurs at the boundary between layers. Thus, plural standing waves exist. A standing wave generated at the boundary between layers having a high reflectance of the plural standing waves is defined as a principal mode. In the first exemplary embodiment, due to the provision of the phase shift layer 108, a phase-shifted standing wave is formed inside the semiconductor layer. As illustrated in FIG. 5, at the time of emission toward the outside, light having two principal modes is generated.

Meanwhile, the spontaneous emission spectrum has a peak wavelength between the principal modes of the resonator spectrum. The semiconductor composition (more specifically, the composition of $Al_xGa_{1-x}As$) of the light-emitting layer 106 is determined so as to obtain the corresponding peak wavelength.

Figure 6:
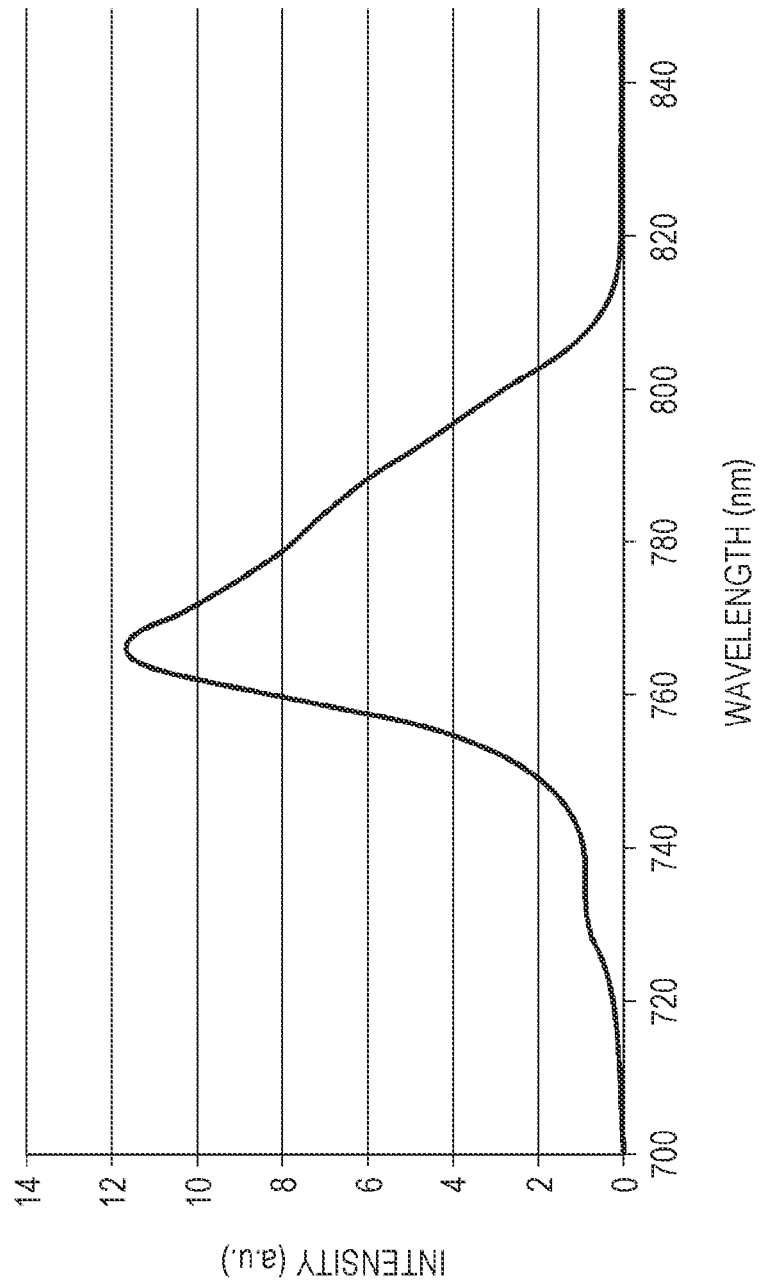
FIG. 6 is an explanatory diagram for explaining a specific example of the wavelength and intensity of the emission spectrum in the case illustrated in FIG. 5.

Since the emission spectrum is obtained by multiplying the resonator spectrum and the spontaneous emission spectrum, a broad spectrum (compared to a related art) is obtained as the emission spectrum, as illustrated in FIG. 6.

Figure 7:
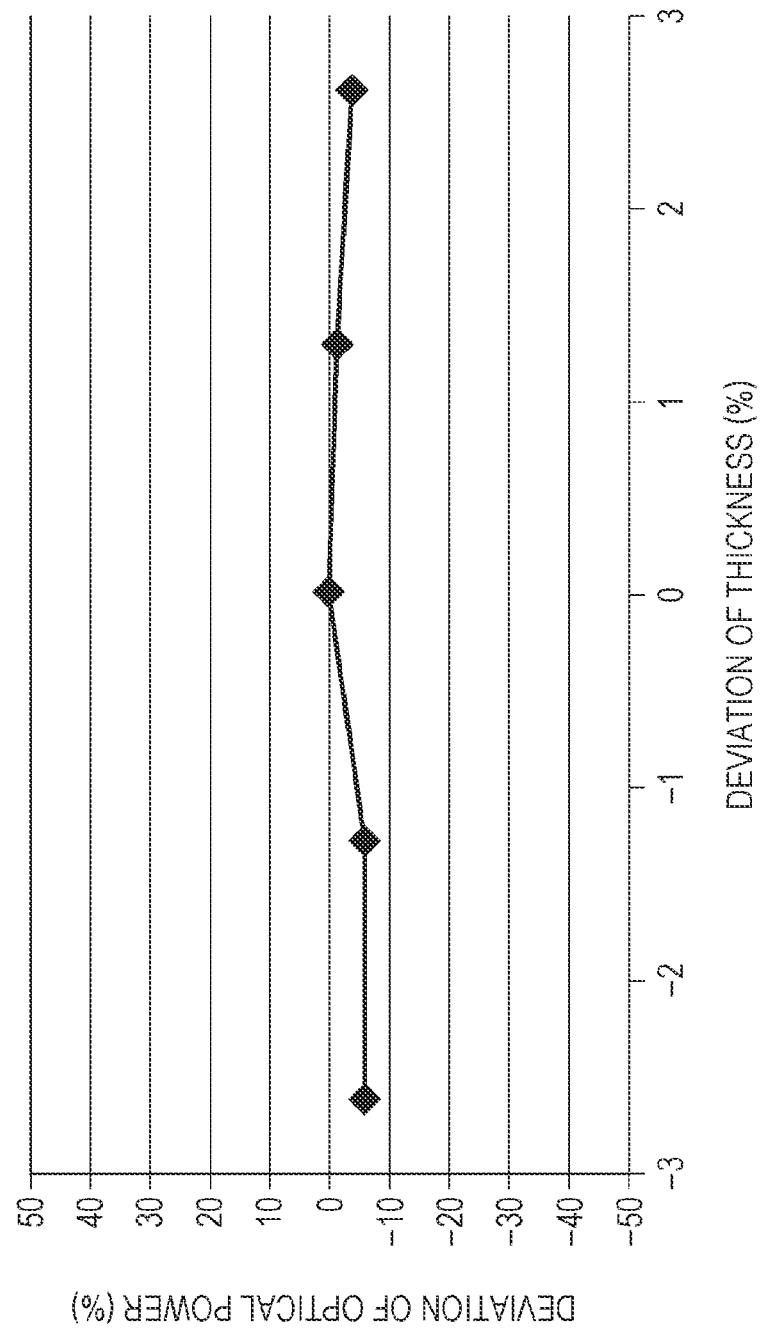
FIG. 7 is an explanatory diagram illustrating the relationship between the thickness and the optical power of the semiconductor light-emitting element according to the first exemplary embodiment.

FIG. 7 illustrates the relationship between the thickness and the optical power of the semiconductor light-emitting element 100 according to the first exemplary embodiment. In the semiconductor light-emitting element 100 according to the first exemplary embodiment, in the case where film thickness distribution occurs inside a wafer in the process of manufacturing as described in the explanation for the related art, the resonator spectrum is shifted toward a shorter wavelength side or a loner wavelength side. Due to the shift of the resonator spectrum, although the light intensity (light amount) from one of the two principal modes increases, the light intensity (light amount) from the other principal mode decreases. Thus, fluctuations in the total optical power are suppressed. Consequently, as illustrated in FIG. 7, variations in the optical power according to the film thickness are suppressed.

Figure 8:
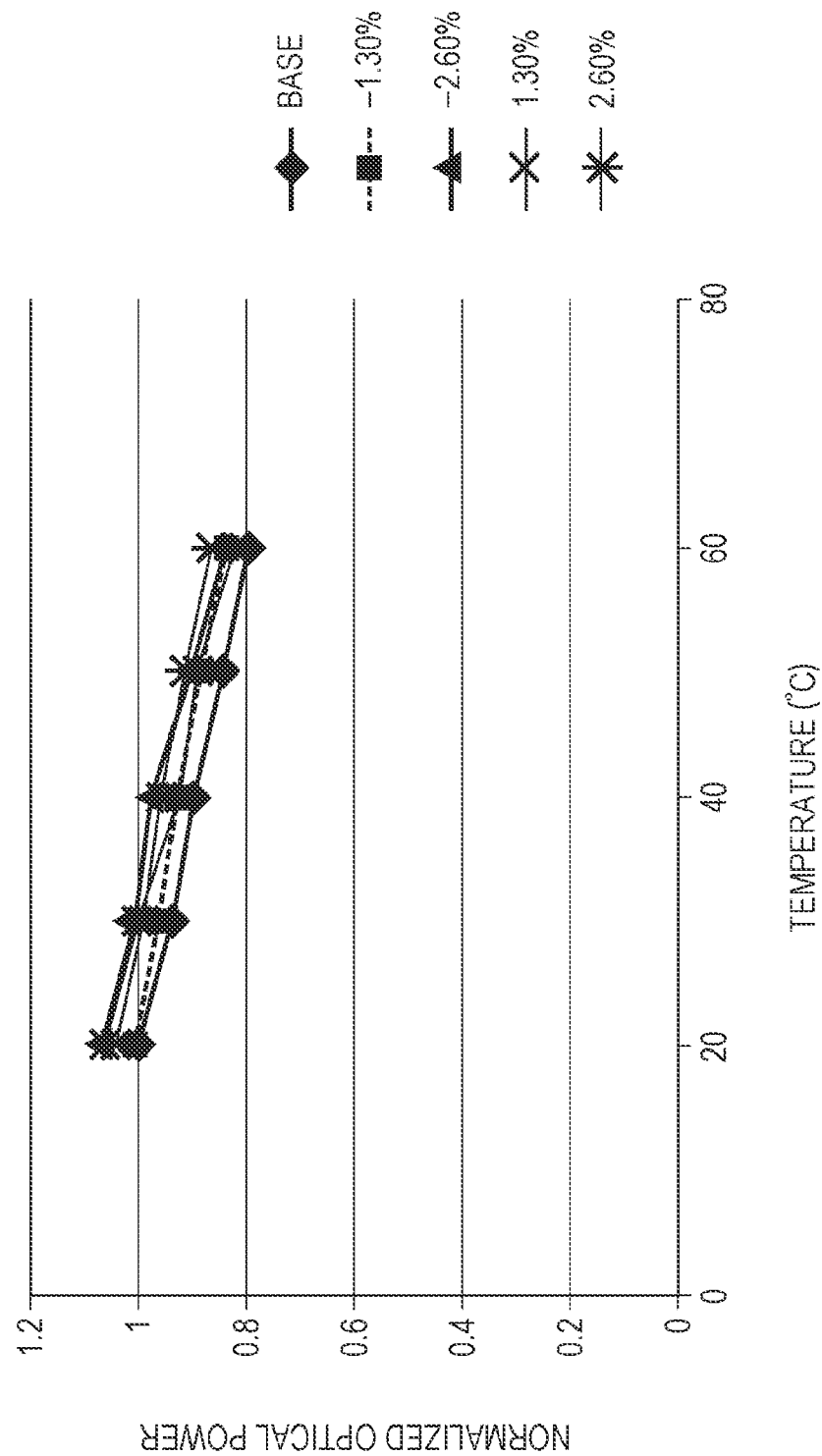
FIG. 8 is an explanatory diagram illustrating the temperature characteristics of the semiconductor light-emitting element according to the first exemplary embodiment.

FIG. 8 illustrates the temperature characteristics of the semiconductor light-emitting element 100 according to the first exemplary embodiment. In the semiconductor light-emitting element 100 according to the first exemplary embodiment, similar to the case described above, in the case where the peak of the spontaneous emission spectrum is shifted by a temperature change, the light amount from one of the principal modes increases and the light amount from the other principal mode decreases. Thus, variations in the total optical power are suppressed. Consequently, temperature-dependent variations according to the film thickness are suppressed, as illustrated in FIG. 8.

Specific examples of the semiconductor light-emitting element 100 according to the first exemplary embodiment will now be explained. In each example, explanation for common features of the configuration and common operations may be omitted.

Example 1

The semiconductor light-emitting element 100 in which the phase shift layer 108 is arranged between the light-emitting layer 106 and a light-emitting surface, will be explained. In the semiconductor light-emitting element 100 according to Example 1, the thickness of the phase adjustment layer 110 is greater than the other examples.

FIG. 9 illustrates a specific example of the Al composition and film thickness of each layer of the semiconductor light-emitting element 100 according to Example 1. In the semiconductor light-emitting element 100 according to Example 1, for example, Zn is used as a dopant for a p-type, and Si is used as a dopant for an n-type.

The n-type AlGaAs-system DBR layer 104 is stacked on the n-type GaAs substrate 102 with an n-type GaAs-system buffer layer therebetween. Although not illustrated in FIG. 4, in the semiconductor light-emitting element 100 according to Example 1, in order to achieve an excellent crystallizability between the n-type GaAs substrate 102 and the n-type AlGaAs-system DBR layer 104, the n-type GaAs-system buffer layer is provided, as illustrated in FIG. 9.

The n-type AlGaAs-system DBR layer 104 is configured such that ten pairs of a semiconductor layer having an Al composition of 0.30 and a film thickness of 0.25 (¼) $\lambda$ and a semiconductor layer having an Al composition of 0.90 and a film thickness of 0.25 (¼) $\lambda$ are stacked in order from the side of the substrate 102.

The n-type AlGaAs-system barrier layer 106A1 having an Al composition of 0.30 and a film thickness of 1.75$\lambda$, the non-doped AlGaAs-system active layer 106B having an Al composition of 0.14 and a film thickness of 0.5$\lambda$, and the p-type AlGaAs-system barrier layer 106A2 having an Al composition of 0.30 and a film thickness of 1.25$\lambda$ are stacked in that order on the DBR layer 104. Carriers (electrons) injected as minority carriers from the side of the barrier layer 106A1 are moved to the active layer 106B. Furthermore, carriers (positive holes) injected as minority carriers from the side of the barrier layer 106A2 are moved to the active layer 106B. Inside the active layer 106B, emission recombination of the moved electrons and positive holes is carried out.

The p-type AlGaAs-system phase shift layer 108 is configured such that the semiconductor layer 108A1 having an Al composition of 0.90 and a film thickness of 0.25 (¼) $\lambda$, the semiconductor layer 108B having an Al composition of 0.30 and a film thickness of 0.5 (½) $\lambda$, and the semiconductor layer 108A2 having an Al composition of 0.90 and a film thickness of 0.25 (¼) $\lambda$ are stacked in that order from the substrate side.

Furthermore, the p-type AlGaAs-system phase adjustment layer 110 has an Al composition of 0.30 and a film thickness of 2.138$\lambda$. The p-type GaAs contact layer 112 has a film thickness of 0.142$\lambda$. In Example 1, the film thickness of the phase adjustment layer 110 is greater than the other examples (see the description provided below). In general, by arranging the upper electrode 116 on the contact layer 112, emission light is blocked by the upper electrode 116. Thus, the emission light amount is reduced. In the case where the distance between the light-emitting layer 106 and the upper electrode 116 is short, current injected from the upper electrode 116 is not sufficiently spread in horizontal directions. Thus, the proportion of light emission amount in a portion of the light-emitting layer 106 that is below the upper electrode 116 to the light emission amount in the entire light-emitting layer 106 is large, and a large part of the light emitted at the center of the light-emitting layer 106 is shielded. Thus, in Example 1, by making the thickness of the phase adjustment layer 110 that is arranged between the light-emitting layer 106 and the upper electrode 116 thicker, the distance between the light-emitting layer 106 and the upper electrode 116 is increased. The increase in the distance between the light-emitting layer 106 and the upper electrode 116 causes the current injected from the upper electrode 116 to be spread in the horizontal directions, and light emission recombination occurs in the light-emitting layer 106. Thus, the proportion of the light emission amount in the portion of the light-emitting layer 106 that is below the upper electrode 116 to the emission light amount in the entire light-emitting layer 106 is reduced, and the amount of light blocked by the upper electrode 116 is reduced. Therefore, a reduction in the amount of light emitted from the light-emitting surface is suppressed.

Furthermore, by changing the thickness of the phase adjustment layer 110, the resonator length is changed. Thus, a principal mode of the resonator formed by the contact layer 112 and the DBR layer 104 is changed. Therefore, the interval between two principal modes (peak to peak) is adjusted.

For example, a metal organic chemical vapor deposition (MOCVD) method is applied to the crystal growth in each layer of the semiconductor light-emitting element 100.

Figure 10:
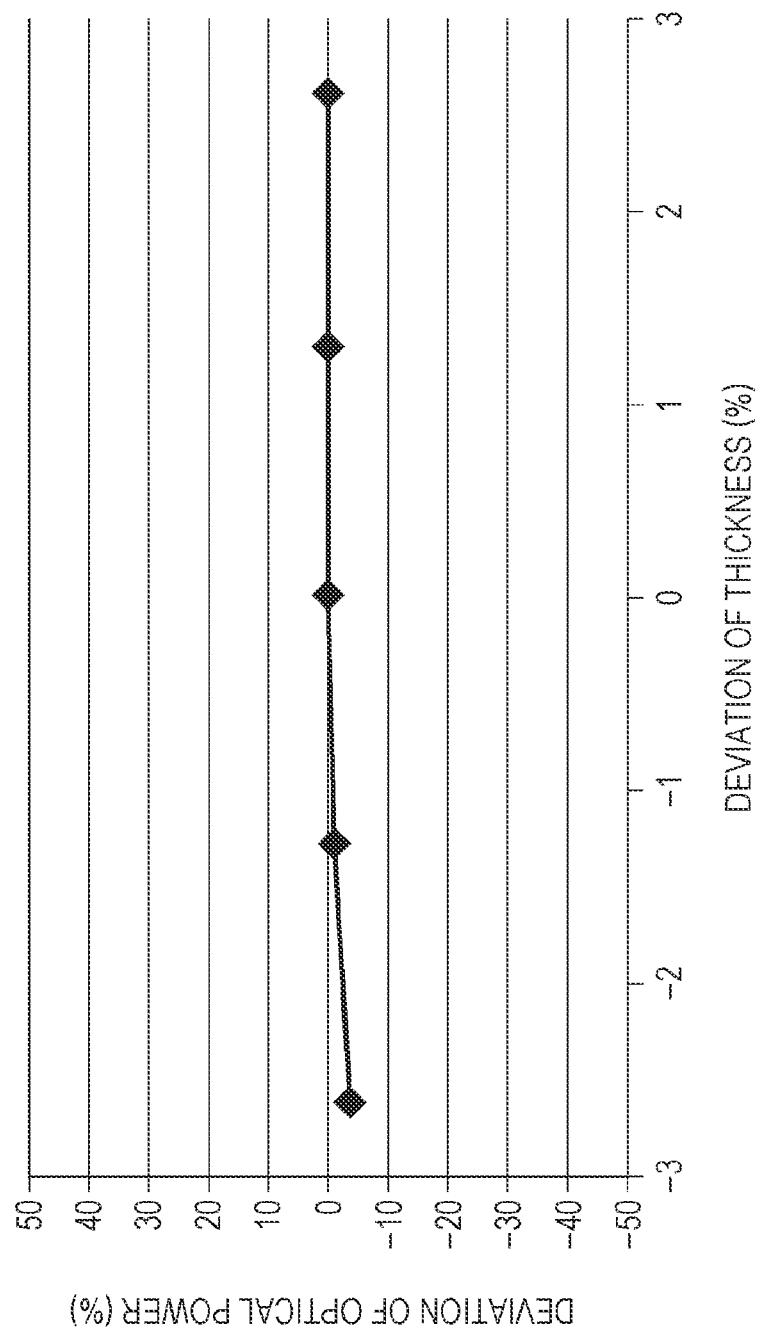
FIG. 10 is an explanatory diagram illustrating the relationship between the thickness and the optical power of the semiconductor light-emitting element according to Example 1.
Figure 11:
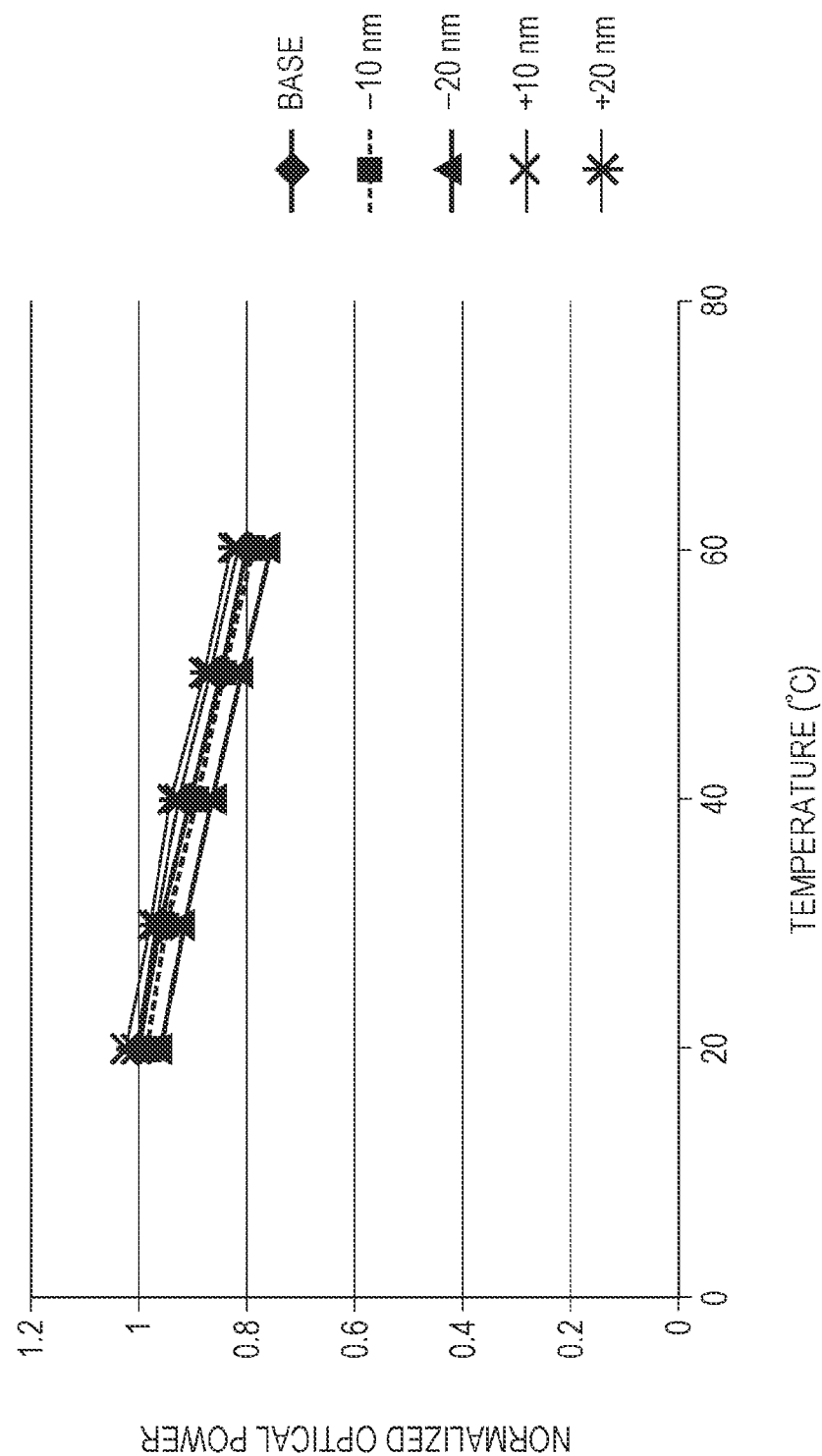
FIG. 11 is an explanatory diagram illustrating the temperature characteristics of the semiconductor light-emitting element according to Example 1.

FIG. 10 illustrates the relationship between the thickness and the optical power of the semiconductor light-emitting element 100 according to Example 1. FIG. 11 illustrates the temperature characteristics of the semiconductor light-emitting element 100 according to Example 1.

As described above, also in the semiconductor light-emitting element 100 according to Example 1, due to the provision of the phase shift layer 108, variations in the optical power according to the film thickness are suppressed. Furthermore, temperature-dependent variations according to the film thickness are also suppressed.

Example 2

The semiconductor light-emitting element 100 in which the phase shift layer 108 is arranged between the light-emitting layer 106 and the light-emitting surface and a resonator adjustment layer is arranged between the light-emitting layer 106 and the phase shift layer 108, will be explained.

FIG. 12 illustrates a specific example of the Al composition and film thickness of each layer of the semiconductor light-emitting element 100 according to Example 2.

The n-type AlGaAs-system DBR layer 104 is stacked on the n-type GaAs substrate 102 with an n-type GaAs-system buffer layer therebetween. The n-type AlGaAs-system DBR layer 104 is configured such that ten pairs of a semiconductor layer having an Al composition of 0.30 and a film thickness of 0.25 (¼) λ and a semiconductor layer having an Al composition of 0.90 and a film thickness of 0.25 (¼) λ are stacked in order from the side of the substrate 102. The light-emitting layer 106 is formed on the DBR layer 104. The light-emitting layer 106 is configured such that the n-type AlGaAs-system barrier layer 106A1 having an Al composition of 0.30 and a film thickness of 1.75λ, the non-doped AlGaAs-system active layer 106B having an Al composition of 0.14 and a film thickness of 0.5λ, and the p-type AlGaAs-system barrier layer 106A2 having an Al composition of 0.30 and a film thickness of 1.5λ are stacked in that order.

Furthermore, in Example 2, a resonator adjustment layer is arranged on the light-emitting layer 106. The resonator adjustment layer is a p-type AlGaAs-system semiconductor layer having an Al composition of 0.30 and a film thickness of 2.0λ.

In general, the mode of the wavelength of a standing wave is selected on the basis of the optical length at the layer boundary. The mode interval decreases as the optical length increases, and the mode interval increases as the optical length decreases. In the semiconductor light-emitting element 100 according to Example 2, a resonator including the DBR layer 104 and the phase shift layer 108 and a resonator including the DBR layer 104 and the interface of the contact layer 112 each exhibit a strong mode, which serves as a principal mode. Here, by changing the thickness of the resonator adjustment layer, the resonator length of each of the resonators changes. Furthermore, in accordance with a change in the resonator length, the interval between principal modes also changes. In Example 2, the interval between principal modes is adjusted using the resonator adjustment layer.

Furthermore, due to the provision of the resonator adjustment layer, the distance between the light-emitting layer 106 and the upper electrode 116 increases. Thus, as described above, advantages similar to those achieved in the case where the thickness of the phase adjustment layer 110 is made to be thicker are achieved.

As in Example 1, the phase shift layer 108 is formed on the resonator adjustment layer. The p-type AlGaAs-system phase adjustment layer 110 having an Al composition of 0.30 and a film thickness of 0.138λ is formed on the phase shift layer 108. Furthermore, the p-type AlGaAs-system contact layer 112 having a film thickness of 0.142λ is formed on the phase adjustment layer 110.

Example 3

The semiconductor light-emitting element 100 in which the phase shift layer 108 is arranged between the light-emitting layer 106 and the light-emitting surface and a DBR layer is arranged on the phase shift layer 108, will be explained.

FIG. 13 illustrates a specific example of the Al composition and film thickness of each layer of the semiconductor light-emitting element 100 according to Example 3.

The n-type AlGaAs-system DBR layer 104 is stacked on the n-type GaAs substrate 102 with an n-type GaAs-system buffer layer therebetween. The n-type AlGaAs-system DBR layer 104 is configured such that ten pairs of a semiconductor layer having an Al composition of 0.30 and a film thickness of 0.25 (¼) λ and a semiconductor layer having an Al composition of 0.90 and a film thickness of 0.25 (¼) λ are stacked in order from the side of the substrate 102. The light-emitting layer 106 is formed on the DBR layer 104. The light-emitting layer 106 is configured such that the n-type AlGaAs-system barrier layer 106A1 having an Al composition of 0.30 and a film thickness of 1.75λ, the non-doped AlGaAs-system active layer 106B having an Al composition of 0.14 and a film thickness of 0.5λ, and the p-type AlGaAs-system barrier layer 106A2 having an Al composition of 0.30 and a film thickness of 1.25λ are stacked in that order. As in Example 1, the phase shift layer 108 is formed on the light-emitting layer 106.

A p-type DBR layer having a configuration in which four pairs of a semiconductor layer having an Al composition of 0.30 and a film thickness of 0.25 (¼) λ and a semiconductor layer having an Al composition of 0.90 and a film thickness of 0.25 (¼) λ are stacked in order from the side of the substrate 102, is formed on the light-emitting layer 106.

Furthermore, as in Example 2, the p-type AlGaAs-system phase adjustment layer 110 and the p-type AlGaAs-system contact layer 112 are formed on the p-type DBR layer.

Example 4

The semiconductor light-emitting element 100 in which the phase shift layer 108 is arranged between the light-emitting layer 106 and the light-emitting surface and the phase shift layer 108 is a DBR layer obtained by shifting the phase of the DBR layer 104 by λ/4, will be explained.

FIG. 14 illustrates a specific example of the Al composition and film thickness of each layer of the semiconductor light-emitting element 100 according to Example 4.

As in Examples 2 and 3 described above, a buffer layer, the DBR layer 104, and the light-emitting layer 106 are formed above the n-type GaAs substrate 102. Furthermore, in Example 4, a p-type AlGaAs-system phase shift DBR layer is formed on the light-emitting layer 106.

The p-type AlGaAs-system phase shift DBR layer is configured such that four pairs of a semiconductor layer having an Al composition of 0.30 and a film thickness of 0.25 (¼) λ and a semiconductor layer having an Al composition of 0.90 and a film thickness of 0.25 (¼) λ are stacked in order from the side of the light-emitting layer 106.

The Al composition of the DBR layer 104 adjoining the light-emitting layer 106 is 0.90. In contrast, the Al composition of the phase shift DBR layer adjoining the light-emitting layer 106 is 0.30. As described above, since the DBR order viewed from the light-emitting layer 106 differs between the DBR layers, the composition of Al that is in contact with the light-emitting layer 106 differs between the DBR layers.

In each of the foregoing examples, the phase of the phase shift layer 108 is shifted by arranging the semiconductor layer 108B having a film thickness of λ/2 between the semiconductor layers 108A1 and 108A2 each having a film thickness of λ/4. In Example 4, however, by shifting the phase of the phase shift DBR layer from the phase of the DBR layer 104 by λ/4, standing waves having different phases are generated. Thus, the resonator spectrum has plural (two) principal modes.

Also in Example 4, with the use of the resonator adjustment layer described in Example 2, the optical length of resonators of the DBR layer 104 and the phase shift DBR layer is changed. Since the optical length is changed, the interval between principal modes is adjusted. In particular, since the reflectance of the phase shift DBR layer is large, the mode in the phase shift DBR layer is strong, thus achieving higher effect.

Example 5

The case where the semiconductor light-emitting element 100 is a light-emitting thyristor in which the phase shift layer 108 is arranged between the light-emitting layer 106 and the light-emitting surface, will be explained. Furthermore, in the semiconductor light-emitting element 100 according to Example 5, the thickness of the phase adjustment layer 110 is made thicker, as in Example 1.

FIG. 15 illustrates a specific example of the Al composition and film thickness of each layer of the semiconductor light-emitting element 100, which is a light-emitting thyristor, according to Example 5.

A p-type GaAs-system buffer layer is formed on the p-type GaAs substrate 102, and the p-type DBR layer 104 is formed on the buffer layer. Furthermore, the light-emitting layer 106 is formed on the DBR layer 104.

Since the semiconductor light-emitting element 100 is a light-emitting thyristor, the light-emitting layer 106 is configured such that an n-type AlGaAs-system gate layer having an Al composition of 0.30 and a film thickness of 1.5 (¼) λ, a non-doped active layer having an Al composition of 0.14 and a film thickness of 0.5 (¼) λ, and a p-type AlGaAs-system gate layer having an Al composition of 0.30 and a film thickness of 1.5 (¼) λ are stacked in that order from the side of the DBR layer 104.

Furthermore, the n-type AlGaAs-system phase shift layer 108, the n-type AlGaAs-system phase adjustment layer 110 having a film thickness of 2.138 X, and the n-type GaAs-system contact layer 112 are formed on the light-emitting layer 106.

As described above, also in the case where the semiconductor light-emitting element 100 is formed as a light-emitting thyristor according to Example 5, by providing the phase shift layer 108 in which the semiconductor layer 108B having a film thickness of λ/2 is arranged between the semiconductor layers 108A1 and 108A2 each having a film thickness of λ/4, variations in the optical power according to the film thickness are suppressed. Furthermore, temperature-dependent variations according to the film thickness are also suppressed.

Example 6

Figure 16:
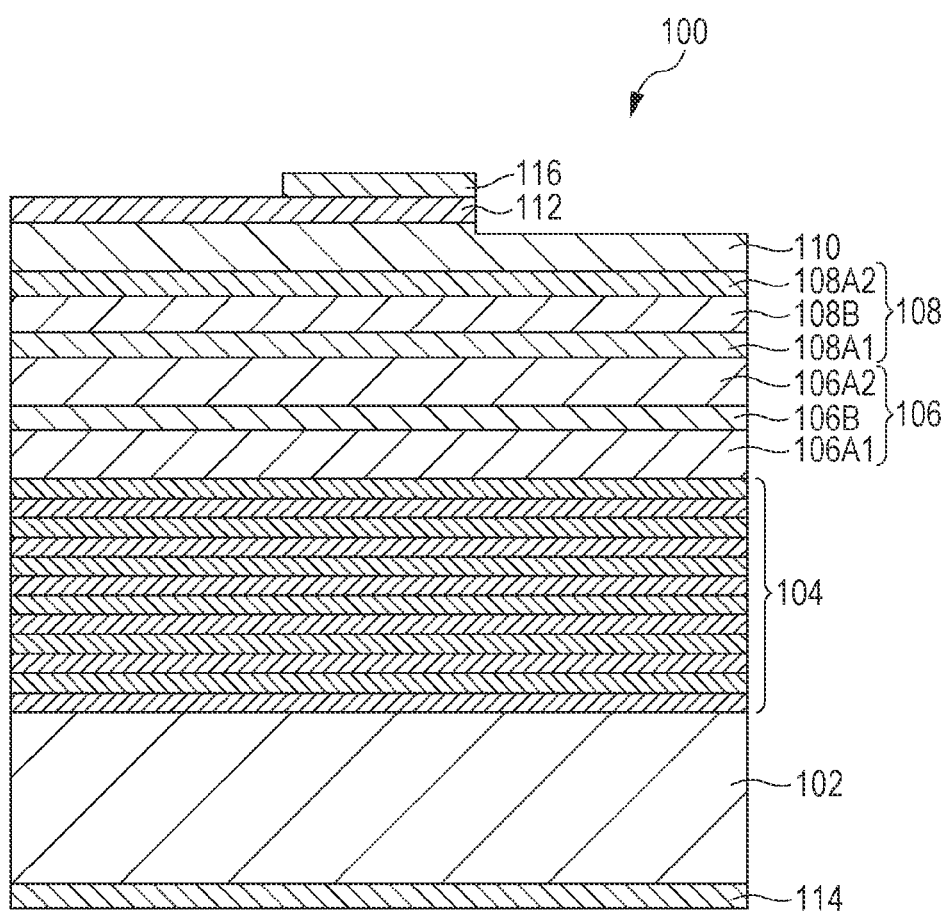
FIG. 16 is a cross-sectional view illustrating the basic schematic configuration of an example of a semiconductor light-emitting element according to Example 6.

The semiconductor light-emitting element 100 in which parts of the contact layer 112 and the phase adjustment layer 110 are removed by etching, will be explained. FIG. 16 is a cross-sectional view of the schematic configuration of a specific example of the semiconductor light-emitting element 100 according to Example 6. Here, for example, the semiconductor light-emitting element 100 according to Example 6 has a configuration substantially similar to the semiconductor light-emitting element 100 illustrated in FIG. 4. However, the configuration of any of the foregoing examples may be used.

As illustrated in FIG. 16, in the semiconductor light-emitting element 100 according to Example 6, after the upper electrode 116 is formed, portions of the contact layer 112 and the phase adjustment layer 110, which are part of a light-emitting region of the light-emitting surface, are removed by etching. It is preferable that the area of the part of the light-emitting surface removed by etching is substantially equal to the area of the remaining part of the light-emitting surface that is not removed.

The phase of the resonator spectrum for the region removed by etching differs from the phase of the resonator spectrum for the remaining region that is not removed. The wavelength of a principal mode is shifted toward a higher wavelength side or a shorter wavelength side. By adjusting the etching depth such that the principal mode of the spectrum for the removed region is located between two principal modes of the resonator spectrum for the region that is not removed, combination of the principal modes form emission light. Thus, it appears as if the resonator spectrum has three principal modes.

Thus, fluctuations in the optical power according to film thickness distribution and temperature fluctuations are averaged, and variations are further suppressed.

Second Exemplary Embodiment

Figure 17:
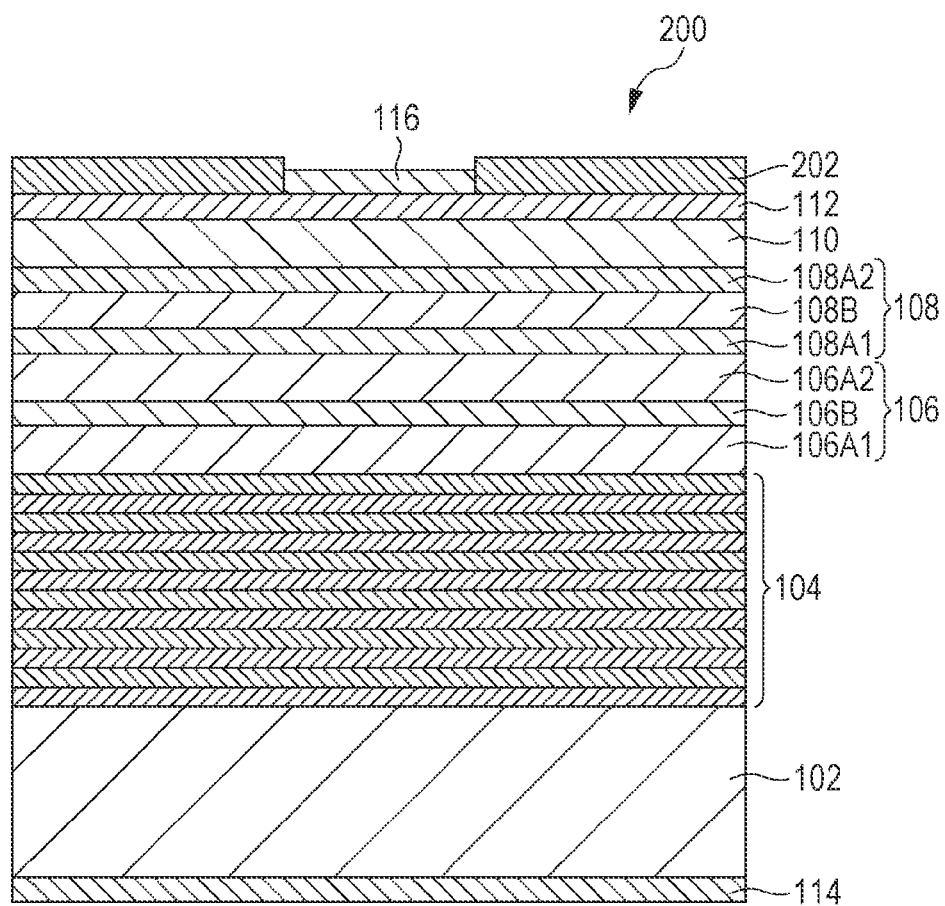
FIG. 17 is a cross-sectional view illustrating the basic schematic configuration of an example of a semiconductor light-emitting element according to a second exemplary embodiment.

First, the basic schematic configuration of a semiconductor light-emitting element 200 according to a second exemplary embodiment will be explained. FIG. 17 is a cross-sectional view of the basic schematic configuration of an example of the semiconductor light-emitting element 200 according to the second exemplary embodiment. Since the configuration of the semiconductor light-emitting element 200 according to the second exemplary embodiment is substantially similar to the configuration of the semiconductor light-emitting element 100 according to the first exemplary embodiment, explanation for those substantially similar parts will be omitted, along with description of the similarities.

In the semiconductor light-emitting element 200 according to the second exemplary embodiment, an antireflective film 202 for preventing reflection of light is provided in a region of the light-emitting surface in which the upper electrode 116 is not arranged.

Figure 18:
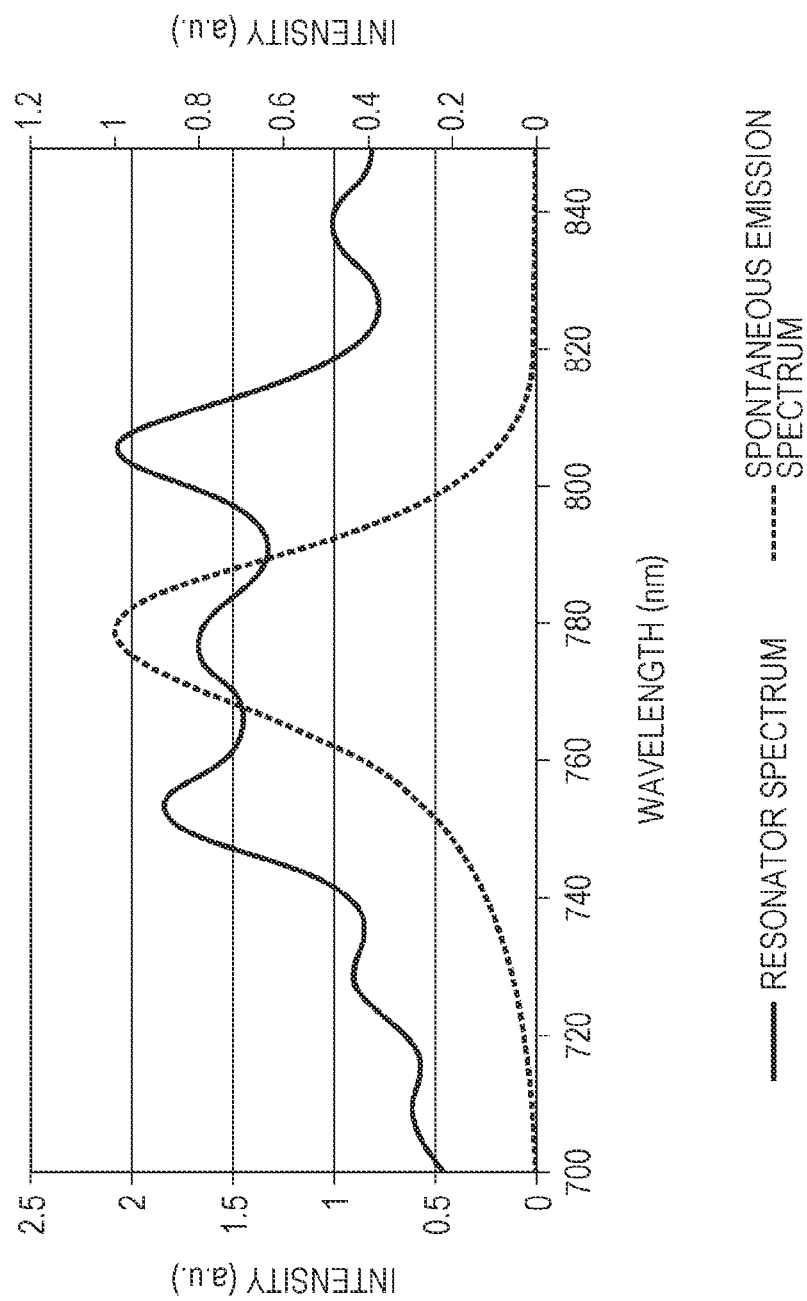
FIG. 18 is an explanatory diagram for explaining a specific example of the wavelength and intensity of the spontaneous emission spectrum and resonator spectrum of the semiconductor light-emitting element according to the second exemplary embodiment.
Figure 19:
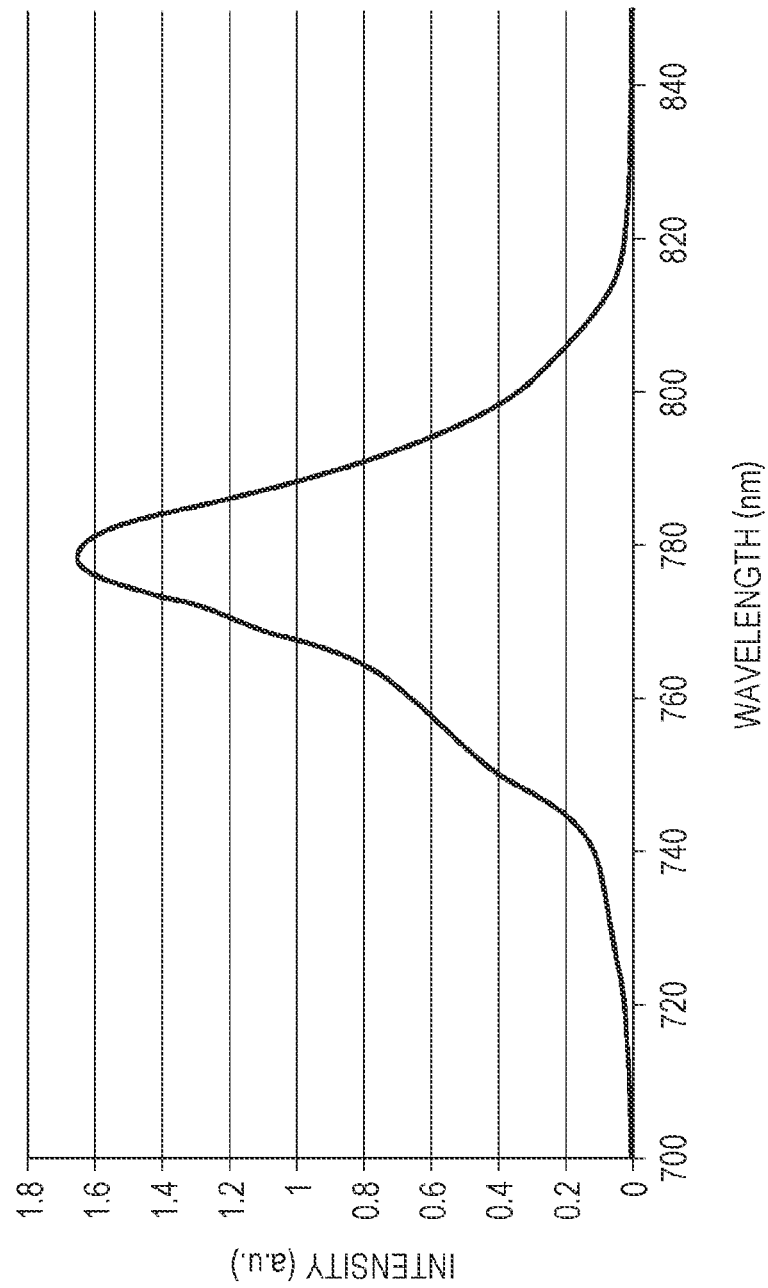
FIG. 19 is an explanatory diagram for explaining a specific example of the wavelength and intensity of the emission spectrum in the case illustrated in FIG. 18.

FIG. 18 illustrates a specific example of the wavelength and intensity of the spontaneous emission spectrum and resonator spectrum of the semiconductor light-emitting element 200 according to the second exemplary embodiment. FIG. 19 illustrates a specific example of the wavelength and intensity of the emission spectrum in this case.

As illustrated in FIG. 18, the resonator spectrum of the semiconductor light-emitting element 200 according to the second exemplary embodiment has three principal modes.

The resonator spectrum of the semiconductor light-emitting element 200 has a shape in which the portion (valley portion) between the principal modes of the resonator spectrum of the semiconductor light-emitting element 100 according to the first exemplary embodiment (see FIG. 5) is lifted, and is flat compared to the resonator spectrum of the semiconductor light-emitting element 100.

When the refractive index of the antireflective film 202 is close to the refractive index of air, a resonator formed inside a semiconductor layer has a principal mode. However, when the refractive index reaches within a specific range, a mode inside the semiconductor layer and a mode of a resonator that is newly formed on the DBR layer 104 by adding the antireflective film 202 to the semiconductor layer have similar intensities. Thus, it is considered that a new mode is generated in the valley portion between the two principal modes of the resonator.

The resonator spectrum becomes flat since the portion between the two principal modes serving as a valley, in which the peak of the spontaneous emission spectrum exists, disappears. Thus, a reduction in the optical power by the valley portion is suppressed. Therefore, even in the case where the resonator spectrum or the spontaneous emission spectrum is shifted, fluctuations in the optical power are suppressed.

In the case where the refractive index of the antireflective film 202 is greater than the refractive index of air and smaller than the refractive index of a compound semiconductor layer (here AlGaAs), an effect is achieved. However, it is more preferable that the conditions described below are met.

Figure 20:
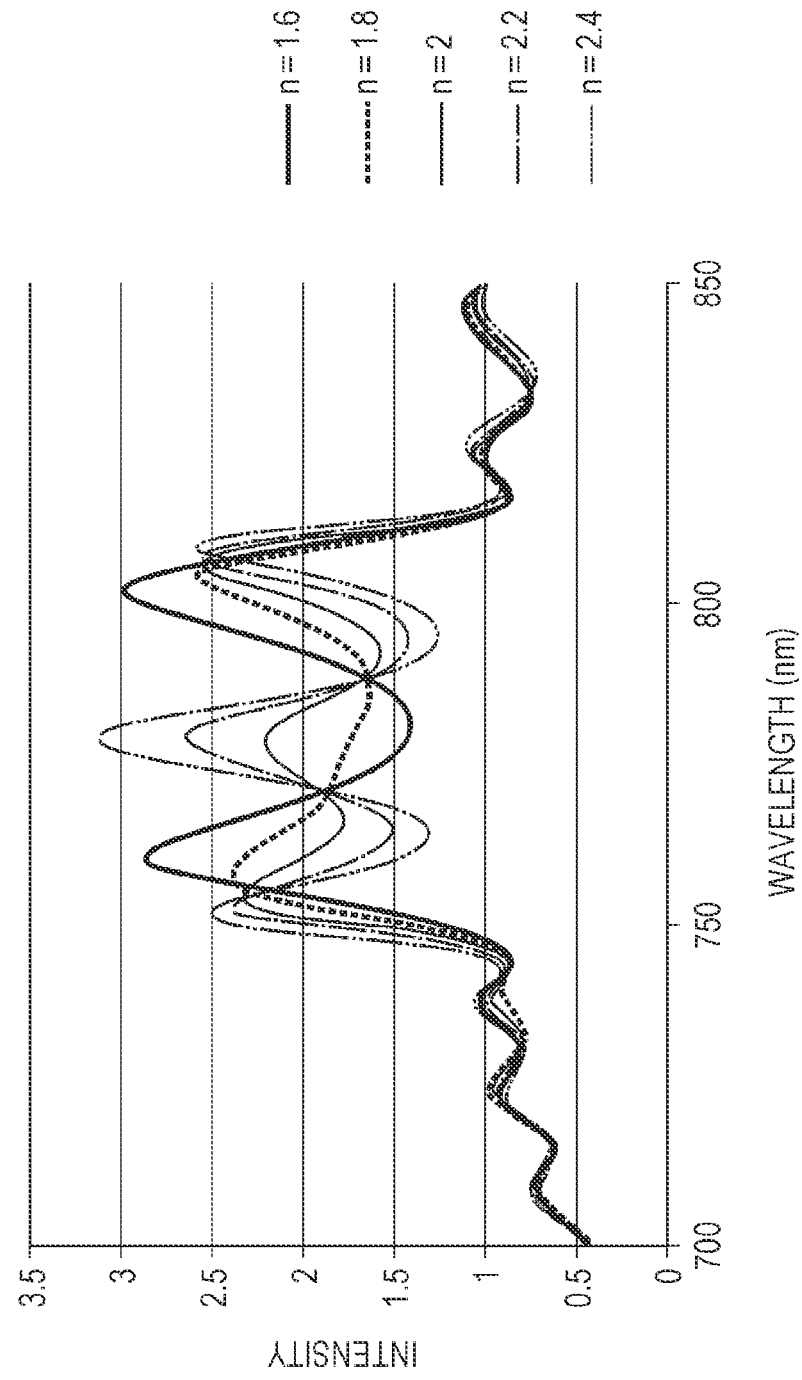
FIG. 20 is an explanatory diagram illustrating a specific example of a change in the resonator spectrum in the case where the refractive index of an antireflective film of the semiconductor light-emitting element according to the second exemplary embodiment is changed.

FIG. 20 illustrates a specific example of a change in the resonator spectrum in the case where the refractive index of the antireflective film 202 is changed. In the case where the refractive index is small, two principal modes exist. In contrast, in the case where the refractive index is large, three principal modes exist. In order that the amount of emission light is not changed even when the relative position between the spontaneous emission spectrum and the resonator spectrum is changed, in the case where the refractive index is small, it is desirable that the portion between the two principal modes has a height that is equal to or more than half the height of the principal modes. In the case where the refractive index is large, it is desirable that the level of the center mode of the three principal modes is less than or equal to the levels of the other modes. Thus, as illustrated in FIG. 20, in the semiconductor light-emitting element 200 having the configuration illustrated in FIG. 17, it is desirable that the refractive index is about 1.8 or more and about 2.2 or less. Materials having such a refractive index include, for example, $SiN_x$, $CeO_2$, $HfO_2$, $La_2O_3$, $Ta_2O_5$, $Y_2O_3$, ZnO, ZrO, and the like.

Furthermore, a film thickness may be set such that a mode generated by a resonator formed on the DBR layer 104 by adding the antireflective film 202 to the semiconductor layer is arranged between principal modes. More specifically, it is desirable that the optical length of the resonator is $(0.5 \times m + 0.25) \times \lambda$ (m is an integer). In the case where the film thickness is inappropriate, not the portion between the principal modes but a portion outside the portion between the principal modes may be lifted (a mode may be generated in a portion outside the portion between the principal modes).

Example 1

The semiconductor light-emitting element 200, which is a light-emitting thyristor including the antireflective film 202, in which the phase shift layer 108 is provided between the light-emitting layer 106 and the light-emitting surface, will be explained. Features of portions other than film thickness are similar to those in Example 1 of the first exemplary embodiment.

FIG. 21 illustrates a specific example of the Al composition and film thickness of each layer of the semiconductor light-emitting element 200, which is a light-emitting thyristor, according to Example 1.

In the semiconductor light-emitting element 200 according to Example 1, as described above, a mode is generated between (valley) principal modes of the resonator spectrum, and the resonator spectrum thus becomes flat. Therefore, even in the case where the resonator spectrum or the spontaneous emission spectrum is shifted, fluctuations in the optical power are suppressed.

Example 2

The semiconductor light-emitting element 200, which is a light-emitting thyristor including the antireflective film 202, in which the multilayered phase shift layer 108 is provided between the light-emitting layer 106 and the light-emitting surface, will be explained. Features of portions other than film thickness are similar to those in Example 1 of the first exemplary embodiment.

FIG. 22 illustrates a specific example of the Al composition and film thickness of each layer of the semiconductor light-emitting element 200, which is a light-emitting thyristor, according to Example 2.

In the semiconductor light-emitting element 200 according to Example 2, the configuration of the phase shift layer 108 is different from that in Example 1. In Example 2, the phase shift layer 108 has a five-layered structure. The phase shift layer 108 includes three semiconductor layers 108A each having an Al composition of 0.90 and a film thickness of 0.25 (¼) λ and two semiconductor layers 108B each having an Al composition of 0.30 and a film thickness of 0.5 (½) λ. Each of the semiconductor layers 108B is sandwiched between corresponding semiconductor layers 108A.

As described above, with a multilayer configuration, the resonator spectrum has multiple (three or more) principal modes. Thus, a flat resonator spectrum is achieved.

Example 3

The semiconductor light-emitting element 200, which is a light-emitting thyristor including the antireflective film 202, in which the multilayered phase shift layer 108 is provided between the light-emitting layer 106 and the substrate 102, will be explained. FIG. 23 illustrates a specific example of the Al composition and film thickness of each layer of the semiconductor light-emitting element 200, which is a light-emitting thyristor, according to Example 3.

In the semiconductor light-emitting element 200 according to Example 3, the n-type AlGaAs-system phase shift layer 108 is provided between the substrate 102 and the light-emitting layer 106. In Example 3, unlike the foregoing examples, the DBR layer 104 has an eight-layered structure.

Even in the case where the phase shift layer 108 is provided between the substrate 102 and the light-emitting layer 106 as described above, the resonator spectrum has two principal modes, as described above. In this case, it is desirable that the phase shift layer 108 is provided between the DBR layer 104 and the light-emitting layer 106.

As described in the explanations for the foregoing exemplary embodiments and examples, in each of the semiconductor light-emitting elements 100 and 200, by providing the phase shift layer 108, the resonator spectrum of a resonator has plural modes. Thus, variations in the optical power are suppressed. Therefore, temperature-dependent variations are also suppressed.

Furthermore, as described in the explanations for the second exemplary embodiment, by providing the antireflective film 202 on the light-emitting surface, a mode is generated in a portion (valley) between principal modes of the resonator spectrum. Thus, the resonator spectrum becomes flat. Therefore, even in the case where the resonator spectrum or the spontaneous emission spectrum is shifted, variations in the optical power are suppressed.

The foregoing exemplary embodiments and examples are merely examples of the present invention. Obviously, some of the foregoing exemplary embodiments and examples may be combined together or a change may be made in accordance with circumstances, without departing from the scope of the present invention.

For example, as described in the foregoing exemplary embodiments and examples, the light-emitting layer 106 may be a non-doped, a p-type, or an n-type. The mobility of positive holes is smaller than the mobility of electrons. Thus, for positive holes, spatial spread (spread in the thickness direction and in the in-plane direction of a layer) is small, and a high light-emission efficiency is achieved. Therefore, it is desirable that the light-emitting layer 106 is of a p-type or a non-doped type.

Furthermore, the semiconductor light-emitting elements 100 and 200 may be light-emitting diodes or light-emitting thyristors. Furthermore, the semiconductor light-emitting elements 100 and 200 may be of a PNP-type, an NPN-type, a PNPN-type, or an NPNP-type.

Furthermore, although the semiconductor light-emitting elements 100 and 200 made of an AlGaAs-system material are described as a specific example in the foregoing exemplary embodiments, a light-emitting thyristor made of an InGaAsP-system, AlGaInP-system, InGaN/GaN-system, or the like may be used.

Furthermore, the case in which the semiconductor light-emitting element 100 is used for the light source head 16 of the image forming apparatus 10 of a self-scanning electrophotographic type has been described in the foregoing exemplary embodiments. However, the semiconductor light-emitting element 100 according to the foregoing exemplary embodiments may be used for a different light source head or a different image forming apparatus. Furthermore, the semiconductor light-emitting element 100 may be used for, for example, a light source of a different apparatus, such as a scanner.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light-emitting element formed of a semiconductor layer, the semiconductor light-emitting element comprising:
   a multilayer reflecting mirror formed on a substrate;
   a light-emitting layer formed on the multilayer reflecting mirror;
   a resonator that uses the multilayer reflecting mirror as a lower reflecting mirror and that resonates light emitted from the light-emitting layer; and
   a phase shift layer that that shifts a phase of a resonance spectrum of the resonator to generate a standing wave having a plurality of principal modes.

2. The semiconductor light-emitting element according to claim 1, further comprising an antireflective layer that prevents reflection of light, the antireflective layer being arranged in an exit region of a light-emitting surface from which light is emitted outside the light-emitting surface.

3. The semiconductor light-emitting element according to claim 2, wherein a refractive index of the antireflective layer is about 1.8 or more and about 2.2 or less.

4. The semiconductor light-emitting element according to claim 3, wherein a length of each of the antireflective layer and the resonator is $(0.5*m+0.25)*\lambda$, where $\lambda$ represents a value obtained by dividing a peak wavelength of light emitted outside the light-emitting surface by a refractive index of the semiconductor layer and m represents an integer.

5. The semiconductor light-emitting element according to claim 1, wherein in a case where $\lambda$ represents a value obtained by dividing a peak wavelength of light emitted outside the light-emitting surface by a refractive index of the semiconductor layer, the phase shift layer is a semiconductor layer including a combination of a first semiconductor layer having a film thickness of $\lambda/4$, a second semiconductor layer having a film thickness of $\lambda/2$ and having a band gap energy smaller than the first semiconductor layer, and the first semiconductor layer having a film thickness of $\lambda/4$.

6. The semiconductor light-emitting element according to claim 5, wherein the phase shift layer has a plurality of the combinations.

7. The semiconductor light-emitting element according to claim 1, wherein in a case where $\lambda$ represents a value obtained by dividing a peak wavelength of light emitted outside the light-emitting surface by a refractive index of the semiconductor layer, the phase shift layer is a multilayer reflecting mirror whose phase is shifted from the multilayer reflecting mirror by $\lambda/4$.

8. The semiconductor light-emitting element according to claim 1, wherein the phase shift layer is arranged between the light-emitting layer and the light-emitting surface or between the light-emitting layer and the multilayer reflecting mirror.

9. The semiconductor light-emitting element according to claim 1, further comprising a phase adjustment layer that adjusts a phase of the resonator, the phase adjustment layer being arranged between the phase shift layer and the light-emitting surface.

10. The semiconductor light-emitting element according to claim 1, further comprising a resonator adjustment layer that adjusts an optical length of the resonator, the resonator adjustment layer being arranged between the phase shift layer and the light-emitting layer.

11. The semiconductor light-emitting element according to claim 1, wherein the semiconductor element is a light-emitting thyristor or a light-emitting diode.

12. A light source head comprising a plurality of the semiconductor light-emitting elements according to claim 1, as light sources.

13. An image forming apparatus comprising:

a photoreceptor;

a charging unit that charges a surface of the photoreceptor;

an exposure unit that includes the light source head according to claim 12, the exposure unit performing exposure, with light emitted from the light source head, in order to form an electrostatic latent image on the surface of the photoreceptor charged by the charging unit;

a developing unit that develops the electrostatic latent image formed by the exposure unit; and a fixing unit that fixes the electrostatic latent image developed by the developing unit.

14. The semiconductor light-emitting element according to claim 1, wherein the phase shift layer is formed on the multilayer reflecting mirror.

15. The semiconductor light-emitting element according to claim 14, wherein the phase shift layer is formed on the light-emitting layer.

16. The semiconductor light-emitting element according to claim 15, wherein the light-emitting layer is formed between the phase shift layer and the multilayer reflecting mirror.

17. The semiconductor light-emitting element according to claim 1,
    wherein the plurality of principal modes include a first principal mode and a second principal mode, and
    a spontaneous emission spectrum of the semiconductor light-emitting has a peak between the first principal mode and the second principal mode.

18. The semiconductor light-emitting element according to claim 17,
    wherein the plurality of principal modes include a third principal mode between the first principal mode and the second principal mode.

19. The semiconductor light-emitting element according to claim 18,
    wherein the third principal mode has a height that is greater than or equal to half a height of the first principal mode and the second principal mode.

20. The semiconductor light-emitting element according to claim 1,
    wherein, in a case where a peak of a spontaneous emission spectrum is shifted by a temperature change, a light amount from one of the plurality of principal modes increases and a light amount from another of the plurality of principal modes decreases.

* * * * *